US011942142B2

(12) United States Patent
Miyatake

(10) Patent No.: US 11,942,142 B2
(45) Date of Patent: Mar. 26, 2024

(54) MEMORY SUBWORD DRIVER CIRCUITS WITH COMMON TRANSISTORS AT WORD LINES

(71) Applicant: Micron Technology, Inc., Boise, ID (US)

(72) Inventor: Shinichi Miyatake, Kanagawa (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/931,457

(22) Filed: Sep. 12, 2022

(65) Prior Publication Data

US 2023/0005519 A1 Jan. 5, 2023

Related U.S. Application Data

(63) Continuation of application No. 17/006,722, filed on Aug. 28, 2020, now Pat. No. 11,488,655.

(51) Int. Cl.
*G11C 8/08* (2006.01)
*G11C 8/14* (2006.01)
(Continued)

(52) U.S. Cl.
CPC ............ *G11C 11/4085* (2013.01); *G11C 8/08* (2013.01); *G11C 8/14* (2013.01); *G11C 11/4074* (2013.01);
(Continued)

(58) Field of Classification Search
CPC ... G11C 11/4085; G11C 11/4094; G11C 8/08; G11C 11/408; G11C 11/4087; G11C 11/4074; G11C 8/14
See application file for complete search history.

(56) References Cited

U.S. PATENT DOCUMENTS 7,729,195 B2 6/2010 Youn et al.
9,583,152 B1 2/2017 Jeong
(Continued)

FOREIGN PATENT DOCUMENTS

TW 405121 B 9/2000
TW 201322275 A 6/2013
(Continued)

OTHER PUBLICATIONS

U.S. Appl. No. 17/006,730 titled "Memory Subword Driver Layout" filed Aug. 28, 2020, pp. all pages of application as filed.
(Continued)

*Primary Examiner* — Mushfique Siddique
(74) *Attorney, Agent, or Firm* — Dorsey & Whitney LLP

(57) ABSTRACT

Memory subword driver circuits with common transistors are disclosed. In some examples, a subword driver block of a memory device includes a plurality of subword drivers each having an output configured to be coupled to a word line coupled to a plurality of memory cells. The outputs of a first subword driver and a second subword driver of the plurality of subword drivers are coupled to a common transistor and a common word driver line, where the first subword driver and the second subword driver are respectively coupled to a first main word line and a second main word line. In such configuration, the first and second subword drivers are coupled in cascade connection so that, responsive to an active first main word line and an inactive common word driver line, a non-active potential is provided to the first subword driver from the second subword driver via the common transistor.

18 Claims, 19 Drawing Sheets

(51) Int. Cl.
  *G11C 11/4074* (2006.01)
  *G11C 11/408* (2006.01)
  *G11C 11/4094* (2006.01)

(52) U.S. Cl.
  CPC ........ *G11C 11/408* (2013.01); *G11C 11/4087* (2013.01); *G11C 11/4094* (2013.01)

(56) References Cited

U.S. PATENT DOCUMENTS

| | | |
|---|---|---|
| 10,332,584 B2 | 6/2019 | Mochida |
| 11,257,532 B2 | 2/2022 | Suzuki |
| 11,450,375 B2 | 9/2022 | Shirako et al. |
| 11,488,655 B2 | 11/2022 | Miyatake |
| 11,688,455 B2 | 6/2023 | Lee |
| 2004/0156259 A1 | 8/2004 | Ninomiya et al. |
| 2005/0219934 A1 | 10/2005 | Hanzawa et al. |
| 2005/0270889 A1 | 12/2005 | Sekiguchi et al. |
| 2006/0176758 A1 | 8/2006 | Chun |
| 2008/0165563 A1* | 7/2008 | Ohgami ............ G11C 11/4094 365/72 |
| 2010/0142246 A1 | 6/2010 | Okahiro et al. |
| 2012/0120706 A1 | 5/2012 | Ohgami |
| 2013/0155801 A1* | 6/2013 | Yun ................... G11C 5/02 365/230.06 |
| 2015/0055394 A1 | 2/2015 | Iwasa et al. |
| 2015/0117079 A1 | 4/2015 | Yun et al. |
| 2015/0255146 A1* | 9/2015 | Mochida ............... G11C 8/08 365/72 |
| 2017/0005096 A1 | 1/2017 | Lee |
| 2017/0103798 A1 | 4/2017 | Mochida |
| 2018/0166119 A1* | 6/2018 | Jeong ................... G11C 11/408 |
| 2019/0189186 A1 | 6/2019 | Won et al. |
| 2020/0185024 A1 | 6/2020 | Rehmeyer et al. |
| 2021/0272613 A1 | 9/2021 | Jeong |
| 2022/0068350 A1 | 3/2022 | Miyatake |
| 2022/0068351 A1 | 3/2022 | Shirako et al. |

FOREIGN PATENT DOCUMENTS

| | | |
|---|---|---|
| WO | 2022/047060 | 3/2022 |
| WO | 2022047062 | 3/2022 |
| WO | 2022066462 | 3/2022 |

OTHER PUBLICATIONS

U.S. Appl. No. 17/009,722 titled "Memory Subword Driver Circuits With Common Transistors at Word Lines" filed Aug. 28, 2020, pp. all pages of application as filed.

International Search Report and Written Opinion dated Dec. 16, 2021 for PCT Appl. No. PCT/US2021/047796; pp. all.

TW Office Action dated Aug. 3, 2022 for TW Application No. 110131079, pp. all.

U.S. Appl. No. 17/028,929, titled "Memory Subword Driver Circuits and Layout", dated Sep. 22, 2020, pp. all pages of application as filed.

U.S. Appl. No. 18/313,948, filed May 8, 2023 titled, "Memory Subword Driver Circuits and Layout,".

* cited by examiner

MEMORY SUBWORD DRIVER CIRCUITS WITH COMMON TRANSISTORS AT WORD LINES

CROSS REFERENCE TO RELATED APPLICATION(S)

This application is a continuation of pending U.S. patent application Ser. No. 17/006,722 filed Aug. 28, 2022. The aforementioned application is incorporated herein by reference, in its entirety, for any purpose.

BACKGROUND

A semiconductor memory device, such as a Dynamic Random Access Memory (DRAM), includes a memory cell array having memory cells disposed at intersections between word lines and bit lines. The semiconductor memory device may include hierarchically structured main word lines (MWL) and word lines. The main word line is driven by a respective main word driver and is positioned at an upper hierarchy, and is selected by a first portion of a row address. The word line is driven by a respective subword driver and is positioned at a lower hierarchy, and is selected based on a corresponding main word line and a word driver line (FX) selected by a second portion of the row address.

Due to the scaling down of array access devices in semiconductor fabrication, there is a desire to reduce the number of transistors in a memory device. For example, reducing the number of transistors in subword drivers and/or improving the layout design of the same has become desirable in reducing the die size of the memory device.

DETAILED DESCRIPTION

Certain details are set forth below to provide a sufficient understanding of examples of various embodiments of the disclosure. However, it is appreciated that examples described herein may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components. Shapes and dimensions of the various semiconductor structures shown by the drawings are not to scale. For example, the layout diagrams are provided merely as examples, and the shapes and dimensions may be modified for an actual semiconductor device.

Figure 1:
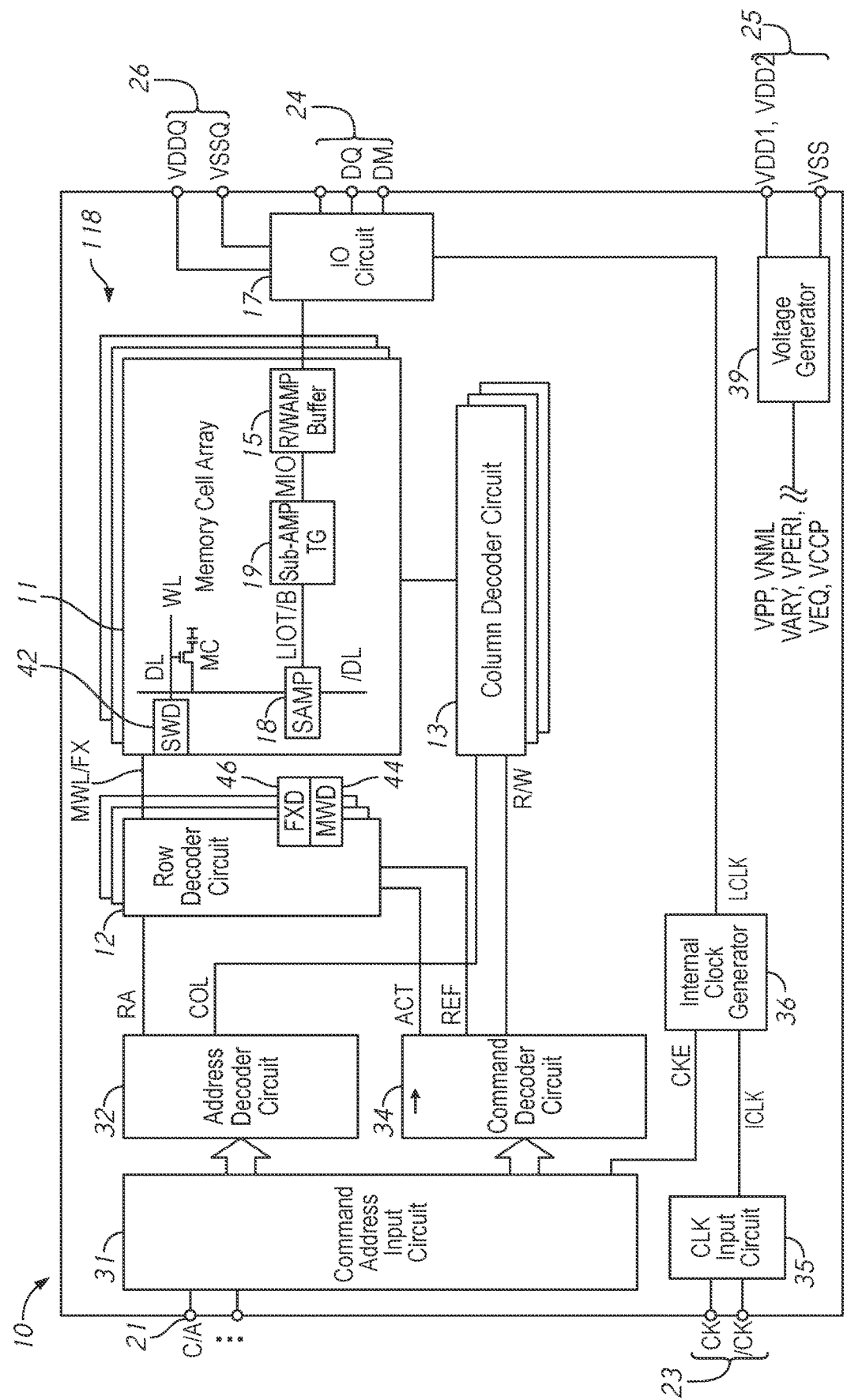
FIG. 1 is a block diagram of a semiconductor device according to some examples described in the disclosure.

FIG. 1 is a block diagram of a semiconductor device 10 according to some examples described in the disclosure. The semiconductor device 10 may be a dynamic random access memory (DRAM) in some embodiments of the disclosure. The semiconductor device 10 includes a memory cell array 11. The memory cell array 11 includes a plurality of word lines WL and a plurality of data lines DL that intersect with each other, with memory cells (MC) disposed at the intersections. The WLs may be driven by respective subword drivers SWD. For clarity, only one WL, SWD, DL, and MC are shown in FIG. 1. A plurality of main word lines MWL and word driver lines FX may be provided to respective SWDs in the memory cell array 11. For example, a selection of a main word line MWL and a word driver line FX is carried out by the row decoder circuit 12, and the selection of the data line DL is carried out by a column decoder circuit 13. In some examples, the word driver lines FX may be driven by respective word drivers FXD 46. The main word lines MWL may be driven by respective main word drivers (MWD) 44. For example, a memory device may have 128 main word lines and 128 main word drivers providing respective main word lines.

In some examples, the semiconductor device 10 may include multiple memory cell arrays 11 arranged in multiple memory banks. The semiconductor device 10 may also include multiple row decoder circuits 12 and multiple column decoder circuits, each coupled to a respective memory cell array 11.

With further reference to FIG. 1, sense amplifiers 18 are coupled to corresponding data lines DL and coupled to local I/O line pairs LIOT/B. Local IO line pairs LIOT/B are coupled to main IO line pairs MIOT/B via transfer gates TG 19 which function as switches to read/write amplifiers and buffers 15.

Turning to the explanation of a plurality of external terminals included in the semiconductor device 10, the plurality of external terminals includes command and address terminals 21, clock terminals 23, data terminals 24, and power supply terminals 25 and 26. The command and address terminals 21 are supplied with command and address signals CA. The CA signals provided to the command and address terminals 21 include commands and addresses. Addresses included in the CA signals are transferred via a command/address input circuit 31 to an address decoder circuit 32. The address decoder circuit 32 receives the addresses and supplies a decoded row address signal RA to the row decoder circuit 12, and a decoded column address signal COL to the column decoder circuit 13.

Commands included in the CA signals provided to the command and address terminals 21 are input to a command decoder circuit 34 via the command/address input circuit 31. The command decoder circuit 34 decodes the commands to provide various internal command signals. For example, the internal commands may include a row command signal to select a word line and a column command signal, such as a read command or a write command, to select a data line.

When a activation command is issued and a row address is timely supplied with the activation command, and a column address is timely supplied with a read command, read data is read from a memory cell MC in the memory cell array 11 designated by these row address and column address. More specifically, the row decoder circuit 12 selects a main word line MWL, word driver line FX, and word line WL indicated by the row address RA so that the associated memory cell MC is subsequently connected to the data line DL. Further, when the memory cell MC is selected by the row address and the associated row is activated by the activation command, the main word line MWL may be active and the word driver line FX may be active. This results in the word line WL being active. Conversely, when the memory cell MC is not selected, e.g., in a precharge operation, the word driver line FX may be inactive, and the main word line MWL may also be inactive. This drives the word line WL to a non-active potential, e.g., off-state word line voltage VNWL. With further reference to FIG. 1, the read data DQ is output externally from the data terminals 24 via a read/write amplifier 15 and an input/output circuit 17.

Similarly, when the activation command is issued and a row address are timely supplied with the activation command, and a column address is timely supplied with a write command, the input/output circuit 17 may receive write data DQ at the data terminals 24. The write data DQ is supplied via the input/output circuit 17 and the read/write amplifier 15 to the memory cell array 11 and written in the memory cell MC designated by the row address and the column address.

The clock terminals 23 are supplied with external clock signals CK and /CK, respectively. These external clock signals CK and /CK are complementary to each other and are supplied to a clock input circuit 35. The clock input circuit 35 receives the external clock signals CK and /CK and provides an internal clock signal ICLK. The internal clock signal ICLK is supplied to an internal clock generator 36 and thus a phase controlled internal clock signal LCLK is provided based on the received internal clock signal ICLK and a clock enable signal CKE from the command/address input circuit 31, In a non-limiting example, a DLL circuit can be used as the internal clock generator 36. The phase controlled internal clock signal LCLK is supplied to the input/output circuit 17 and is used as a timing signal for determining an output timing of the read data DQ.

The power supply terminals 25 are supplied with power supply voltages VDD1, VDD2, and VSS. These power supply voltages VDD1, VDD2, and VSS are supplied to an internal voltage generator circuit 39. The internal voltage generator circuit 39 provides various internal voltages, such as, VPP, VARY, VPERI, VEQ, VCCP, and VNWL.

The internal potentials VCCP, VNWL are potentials to be mainly used in the row decoder circuit 12, the main word drivers MWDs 44 and the word drivers FXDs 46. For example, a word driver FXD, when selected based upon the address signal ADD, may be configured to drive a potential on the word driver line FX to a VCCP level corresponding to a high potential (e.g., 3.1 V), When a row is in pre-charge state, an associated subword driver, responsive to an inactive signal on a main word line (MWL) and an inactive signal on a word driver line (e.g., FXT, FXB), may be configured to pull down the word line (WL) to the internal voltage VNWL (e.g., a non-active potential, which may be a negative voltage).

The internal potential VARY and VEQ are potentials to be used by the sense amplifier 18, transfer gates 19 and/or read/write amplifiers 15. When the sense amplifier 18 is activated, the read data read out is amplified by driving one of the paired data lines to a VARY level with the other one being driven to a VSS level. The internal potential VPERI is used as a power supply potential for most of the peripheral circuits, such as the command/address input circuit 31. By using the internal potential VPERI having a lower potential than the external potential VDD as the power supply potential of these peripheral circuits, it may be possible to reduce power consumption of the semiconductor device 10.

The power supply terminals 26 are supplied with power supply voltages VDDQ and VSSQ. These power supply voltages VDDQ and VSSQ are supplied to the input/output circuit 17. The power supply voltages VDDQ and VSSQ may be the same voltages as the power supply voltages VDD2 and VSS that are supplied to the power supply terminals 25, respectively. However the dedicated power supply voltages VDDQ and VSSQ may be used for the input/output circuit 17 so that power supply noise generated by the input/output circuit 17 does not propagate to the other circuit blocks of device 10.

Figure 2:
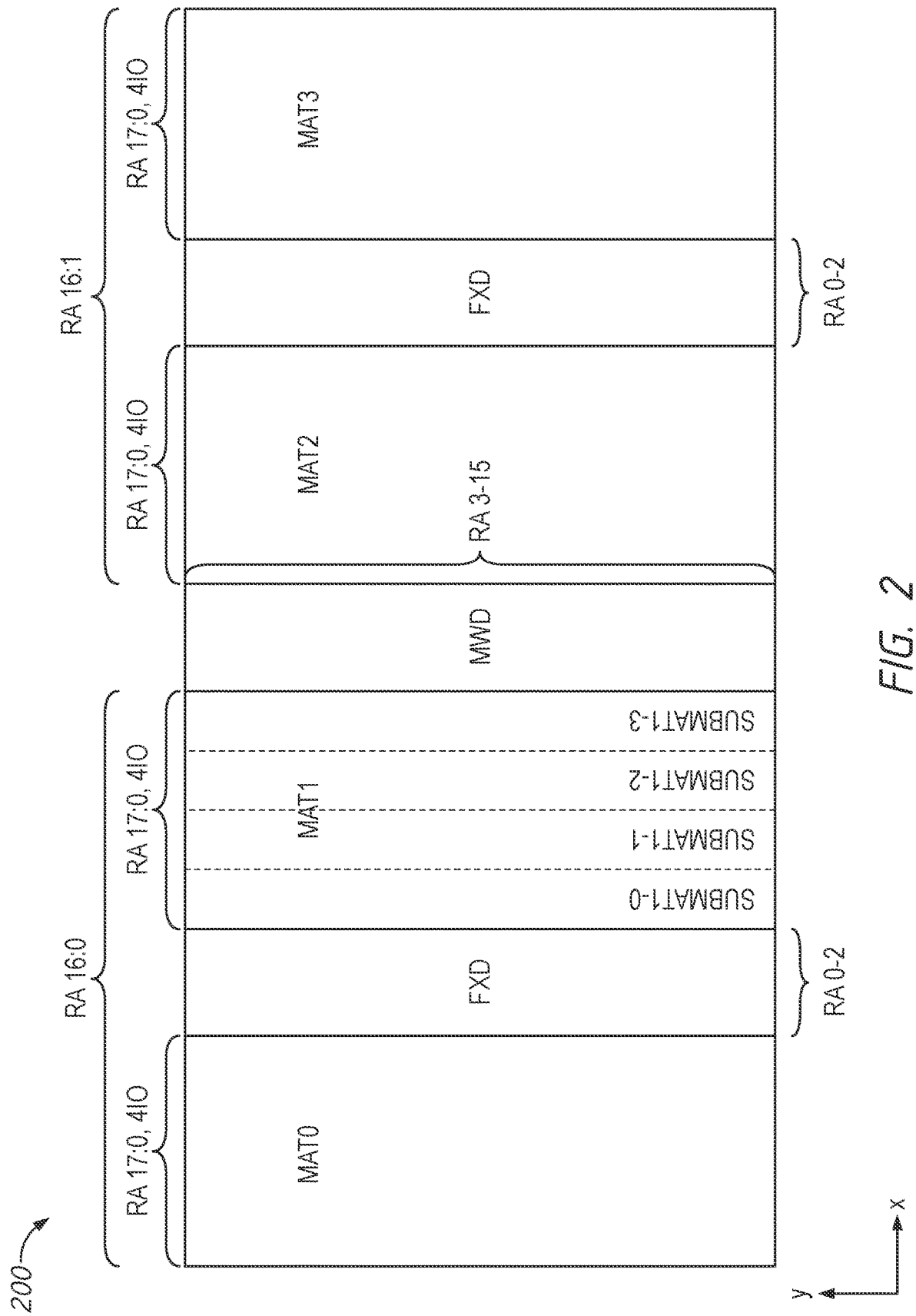
FIG. 2 is a diagram of an example configuration of a memory bank of a semiconductor device according to some examples described in the disclosure.

FIG. 2 is a diagram of an example configuration of a memory bank of a semiconductor device according to some examples described in the disclosure. For example, each of the memory cell array 11 of the device 10 (FIG. 1) may include a configuration of the bank 200 of FIG. 2 in some embodiments of the disclosure.

In some examples, the memory bank 200 may include a plurality of memory mat regions, such as MAT0-3. In the example shown in FIG. 2, the bank 200 has four memory mat regions, but the bank 200 may include more or less memory mat regions in other examples. As indicated by the dotted lines in memory mat region MAT1, each memory mat region may be divided into multiple sub-regions, e.g., SUBMAT1-0-3. While the example shown in FIG. 2 includes four sub-regions, memory mat regions MAT0-3 may include more or less sub-regions in other examples. Each sub-region SUBMAT1-0-3 may include a plurality of memory mats (e.g., 64) aligned in the Y-direction. For clarity, the individual memory mats are not shown in FIG. 2. Subword driver SWD blocks (not shown in FIG. 2) may be disposed on the two sides of each memory mat, e.g., in the X direction. Sense amplifier SA blocks may be disposed on the two sides of each memory mat, e.g., in the Y direction. The memory mats of each sub-region SUBMAT1-0-3 may be provided to a corresponding IO (e.g., DQ pad) in some embodiments.

The subword driver operations may be controlled by a row decoder circuit, for example, the row decoder circuit 12 of FIG. 1. When receiving a row address RA, the row decoder selects a word line WL by activating an appropriate main word driver (MWD) and an appropriate word driver (FXD) indicated by the row address RA. In the example shown in FIG. 2, one block is shown for the main word driver MWD, however, the main word driver MWD block may include a plurality of main word drivers MWDs. Similarly, two blocks are shown for the word drivers FXDs, but each word driver FXD block may include a plurality of word drivers FXDs. For example, if each memory mat region MAT includes four sub-regions and each sub-region includes 64 memory mats, the main word driver MWD block may include 128 MWDs, each configured to activate a corresponding main word line (MWL). Continuing this example, each word driver FXD block may include eight word drivers FXDs, each configured to activate a corresponding word driver line (FX). In the example shown in FIG. 2, bits 3-15 of the row address RA encode the main word line MWL and bits 0-2 of the row address RA encode the word driver line FX. However, other encoding schemes may be used.

Figure 3:
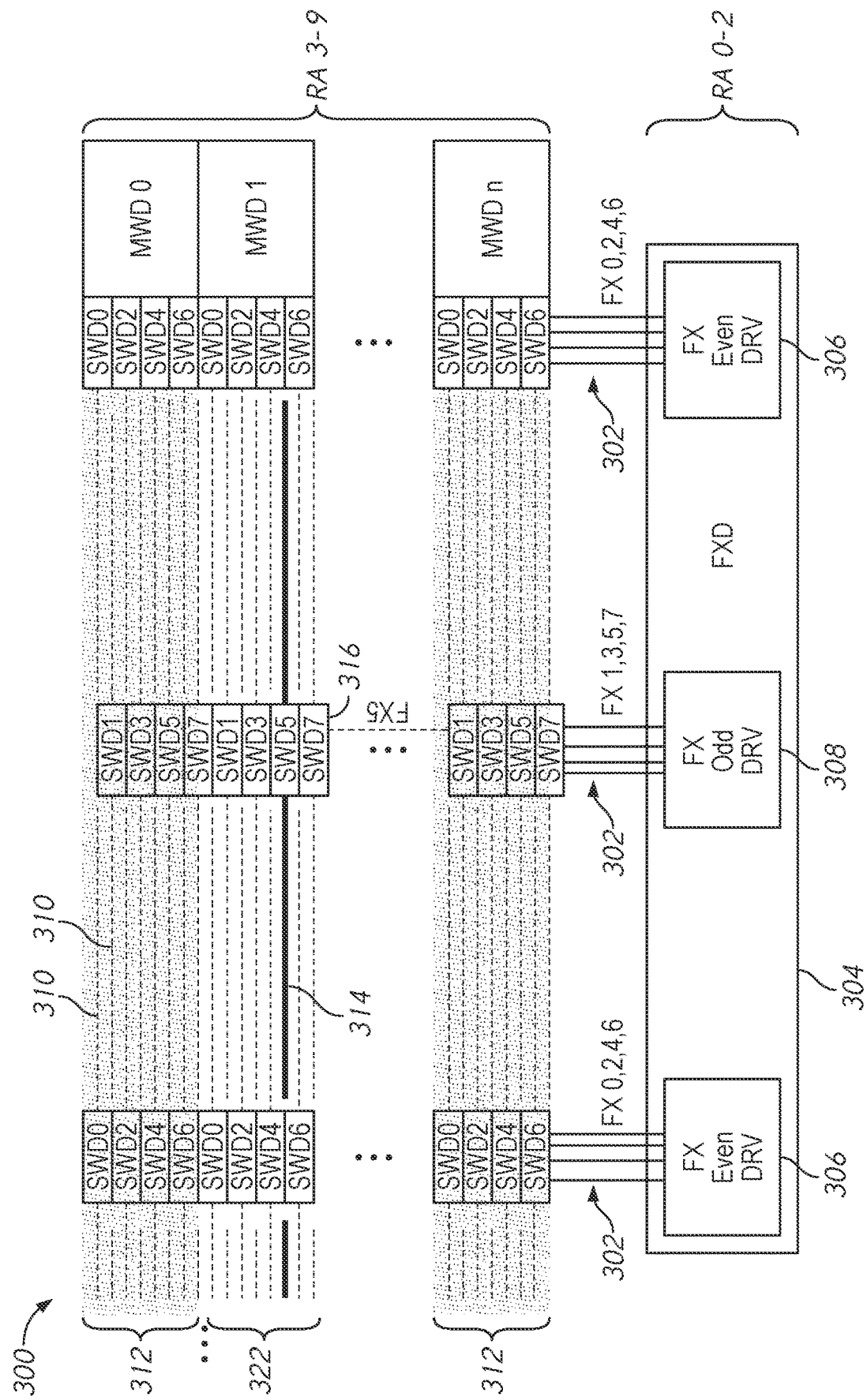
FIG. 3 is a schematic diagram of a portion of a memory bank according to some examples described in the disclosure.

FIG. 3 is a schematic diagram of a portion of a memory bank 300 according to some examples described in the disclosure. In some embodiments of the disclosure, a portion of a bank 300 shown in FIG. 3 may be included in the bank 200 of FIG. 2, and/or the memory cell array 11 of FIG. 1.

The memory portion 300 may include multiple word lines 310, each provided by a respective subword driver SWDj. For example, a word line 314 may be provided by a corresponding subword driver SWD5 associated with a main word line driven by a main word driver MWD1 and also associated with a word driver line 302 (e.g., FX5) associated with a word driver 308. In other words, for each subword driver, a corresponding main word line MWL and word driver line FX and non-active potential (e.g., off-state word line voltage VNWL) are provided. The signals on the main word lines MWLs and the word driver lines FXs may be provided by main word drivers MWD0-N and word drivers FXDs 304, based upon the row address RA as described with reference to FIG. 2.

A main word line MWL may extend over array regions of a respective memory mat to provide the main word signal to the subword driver rows SWD0-7 of the memory mat to activate those subword drivers SWD0-7. That is, when a main word driver MWD is activated, it may provide active main word signals to all the subword drivers SWD0-7 of the mat. As will be described below, a word driver line FX may include FXT and FXB. In some examples, when the FXT is active, the FXB line is inactive. Conversely, the FXB may be active while the FXT is inactive. Each word driver line 302 of word driver FXD 304 provides word driver lines to at least one subword driver SWD in each mat. In the example shown in FIG. 3, the word driver FXD 304 includes even word drivers 306 and odd word drivers 308. The even word drivers 306 provide respective word driver lines to even-numbered subword drivers SWD0, SWD2, SWD4, and SWD6, of each memory mat and odd word drivers 308 provide respective word driver lines to odd-numbered subword drivers SWD1, SWD3, SWD5, and SWD7 of each memory mat. However other arrangements may be used in other examples. In the example shown in FIG. 3, each word driver line of the word driver 304 may be coupled to a corresponding subword driver SWD0-7 in each memory mat. For example, FX line 5 may be coupled to the subword driver SWD5 of each memory mat.

In the example operation shown in FIG. 3, a row address RA has indicated MWD1 should be activated and odd word driver 308 associated with word driver line FX 5 should be activated. As shown by the shaded regions 312, word lines 310 associated with the inactive main word drivers MWD0, MWDn remain inactive, even the subword lines associated with word driver line FX 5 are active. However, among the word lines 322 that are associated with activated MWD1, the word line 314 driven by subword driver SWD5 associated with activated MWD1 and FX 5 is activated. By way of example, an activated MWD may be configured to provide an active signal on the associated main word line, and an activated word driver FXD may be configured to provide an active signal on the word driver line (e.g., FXT, FXB). Similarly, an activated subword driver may be configured to provide an active signal on the associated word line. Thus, a selected word line WL of the selected memory mat associated with MWD1 is driven to the active potential by the corresponding activated subword driver SWD5.

In some examples, the other subword drivers SWD of the selected memory mat drive the respective unselected word lines WL to the non-active potential (e.g., VNWL) to remain inactive. Subword drivers SWD of unselected memory mats MAT (e.g., memory mats associated with MWD0 and MWDn) remain deactivated, and the word lines WL of the unselected memory mats MAT are not provided a voltage, or instead, provided with a non-active potential (e.g., VNWL) in some examples. Whereas a subword driver SWD is coupled to a word driver FXD and a main word driver MWD, in order for a word line WL associated with the subword driver SWD to be activated, both the associated word driver FXD and the main word driver MWD must be activated.

Figure 4:
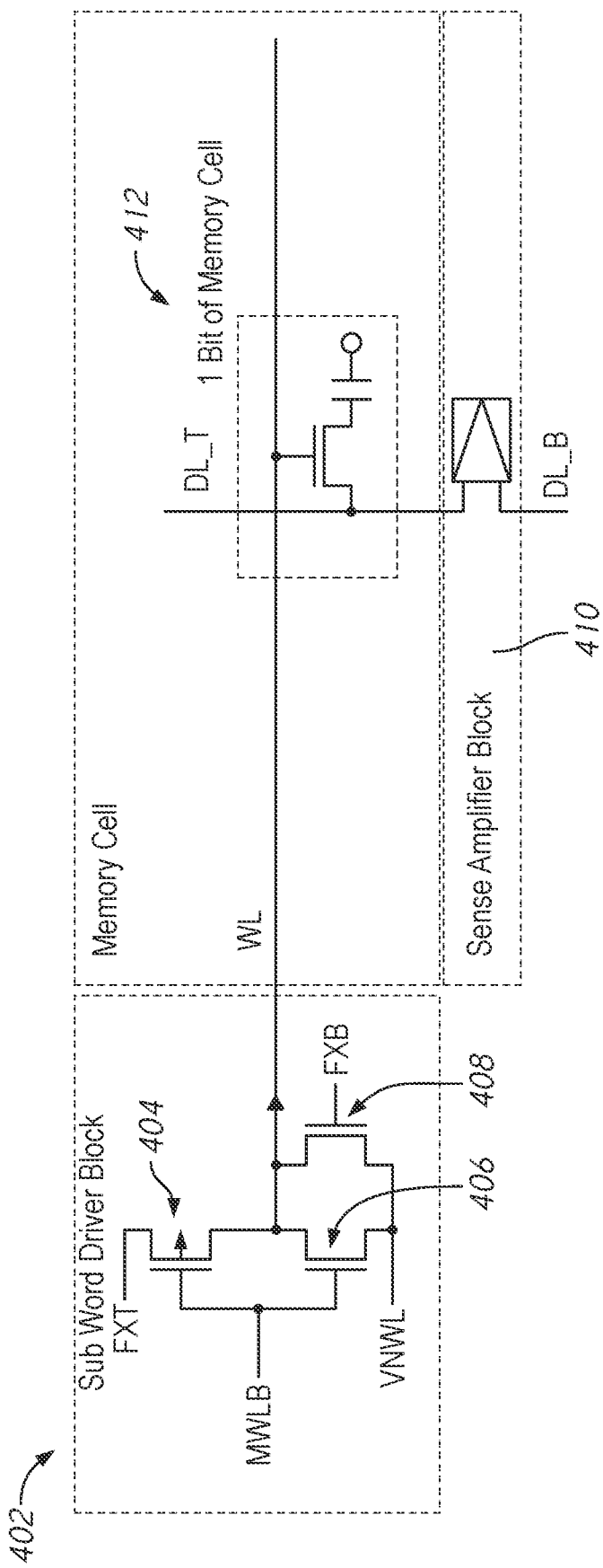
FIG. 4 is a schematic diagram of a subword driver and a memory cell.

FIG. 4 is a schematic diagram of a conventional subword driver and a memory cell. As shown in FIG. 4, the output of a subword driver 402 is coupled to a word line WL, which is coupled to memory cell 412. The memory cell 412 includes at least a transistor and a capacitor. The word line WL is connected to the gate of the transistor and the data line DL is connected to the drain/source (drain or source) of the transistor. The memory cell is capable of storing 1-bit data. The memory cell 412 is coupled to a sense amplifier 410 configured to sense a signal of the memory cell 412 on the data line DL and drive the signal to a desired voltage.

The subword driver 402 includes two transistors of different conductivity types (e.g., a p-channel type transistor 404 and an n-channel type transistor 406) serially coupled at the word line WL. A main word line MWL is coupled to the gates of the transistors 404 and 406. A word driver line FXT is coupled to the drain/source of the transistor 404, and the non-active potential VNWL is provided to the drain/source of the transistor 406. The word line WL is also coupled to the non-active potential VNWL through an n-channel type transistor 408. A word driver line FXB is coupled to the gate of the transistor 408.

The word line of the memory cell 412 is coupled to the subword driver 402, which operates responsive to the signals on the main word line signal and the word driver line FXT. In operation, the transistors 404 and 406 are configured to provide an active/inactive signal on the word line WL. The n-channel type transistor 408 is used to prevent unselected word lines from floating. For example, when the main word line MWLB is active low, the transistor 404 is turned on and the transistor 406 is turned off. If FXT is inactive, the FXB will be active to turn on the transistor 408, which pulls down the potential at the word line WL to VNWL, preventing the word line from floating. As shown in FIG. 4, the subword driver 402 in the conventional circuit includes at least three transistors.

Figure 5:
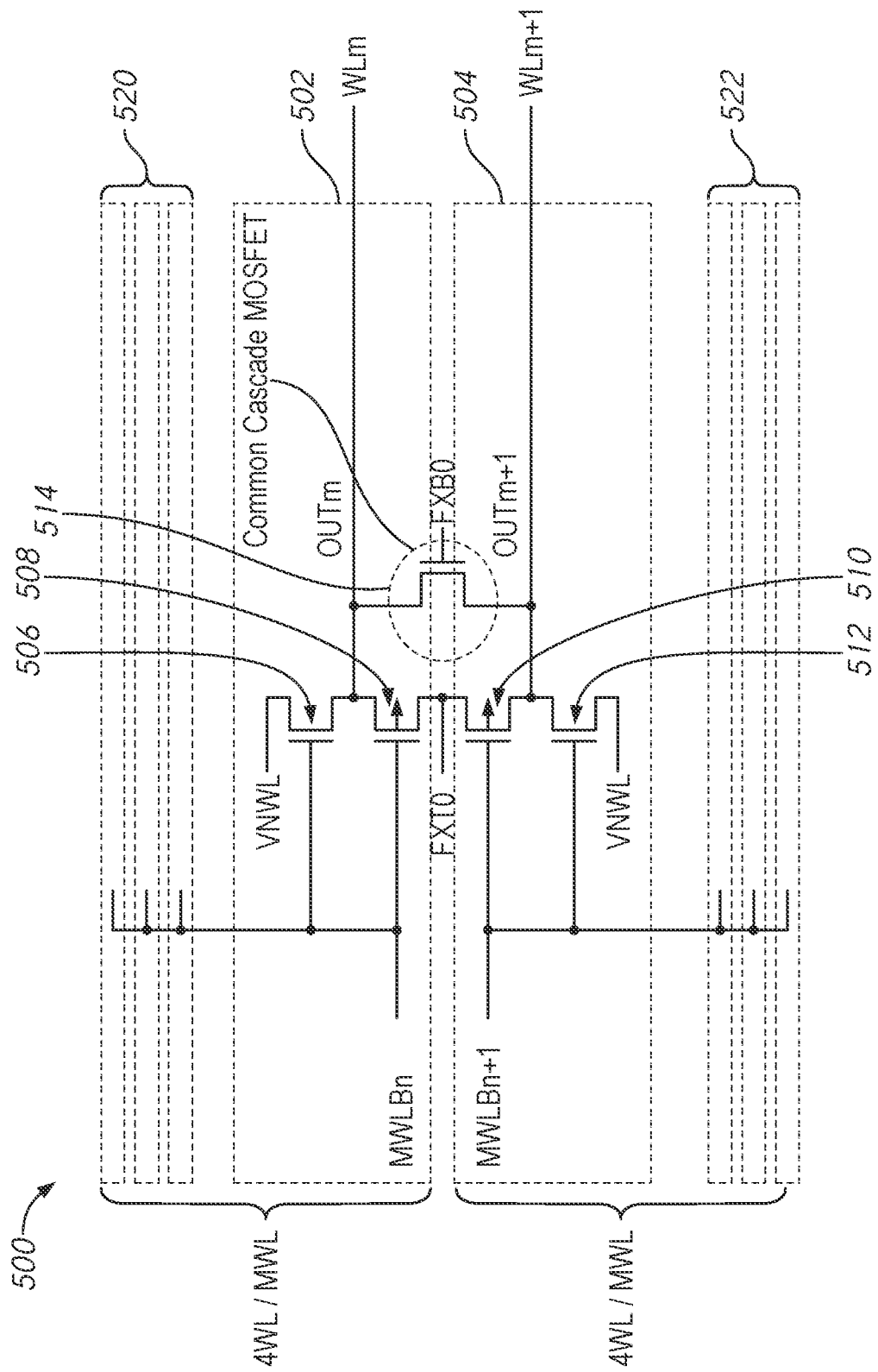
FIG. 5 is a schematic diagram of example subword drivers coupled in cascade connection according to some examples described in the disclosure.

FIG. 5 is a schematic diagram of example subword drivers coupled in cascade connection according to some examples described in the disclosure. Examples of cascade connection may include coupling the output of two or more circuits. For example, the subword drivers 502, 504 may be coupled in cascade connection, as explained in detail in FIG. 5. In some examples, the subword drivers 502 and 504 shown in FIG. 5 may be implemented in the subword drivers 42 (in FIG. 1) or SWD0-7 (in FIG. 3). The subword drivers 502 and 504 may be coupled to different main word lines. For example, subword driver 502 is coupled to main word line MWLBn, whereas subword driver 504 is coupled to main word line MWLBn+1. In some examples, subword driver 502 may include two transistors of different conductivity types (e.g., a p-channel type transistor 508 and an n-channel type transistor 506) coupled at their sources/drains (sources or drains), which are commonly coupled to an output OUTm. The output OUTm may be coupled to a word line WLm. The gates of the transistors 506, 508 may be coupled to a common main word line, e.g., MWLBn. The source/drain of the n-channel type transistor 506 may be coupled to a non-active potential VNWL, whereas the source/drain of the p-channel type transistor 508 may be coupled to the word driver line FXT (e.g., FXT0). Subword driver 502 may also include a common transistor 514 shared with another subword driver, e.g., subword driver 504.

In some examples, the subword driver 504 may have a similar structure as subword driver 502, the description of which is not repeated. The subword driver 504 may be coupled to a main word line, e.g., MWLBn+1, different from the main word line MWLBn to which the subword driver 502 is coupled. The two transistors of different conductivity types (e.g., p-channel type transistor 510 and n-channel type transistor 512) may be commonly coupled at their sources/drains to an output OUTm+1, which is coupled to a word line WLm+1. In some examples, the respective outputs OUTm and OUTm+1 of subword drivers 502 and 504 may be coupled to a common transistor 514 shared by the two subword drivers. In some examples, the common transistor 514 may be an n-channel type transistor, with the gate coupled to a corresponding word driver line FXB (e.g., FXB0). In some examples, the drain/source of the p-channel type transistors of subword drivers 502, 504, in this case, 508, 510, may be coupled at a common word driver line, e.g., FXT0. As shown in FIG. 5, the two subword drivers 502 and 504 share a common transistor 514 at the respective outputs OUTm and OUTm+1 through a cascade connection. As a result, two subword drivers now include a total of five transistors, with an average of 2.5 transistors per subword driver. In comparison to the conventional subword driver shown in FIG. 4, the number of transistors for subword drivers can be reduced, which results in a reduction of memory die size.

Two subword drivers 502 and 504 are shown in FIG. 5, however, other subword drivers in a memory device may be configured in a similar manner. For example, additional subword drivers, e.g., 520, may also be coupled to the main word line MWLBn to which subword driver 502 is coupled. Similarly, additional subword drivers, e.g., 522, may also be coupled to the main word line MWLBn+1 to which subword driver 504 is coupled. In the example shown in FIG. 5, one main word line MWL drives four subword drivers to provide signals on four word lines (only one is shown). However, other number of subword drivers may be coupled to the same main word line driver, as will be shown in FIG. 6.

Figure 6:
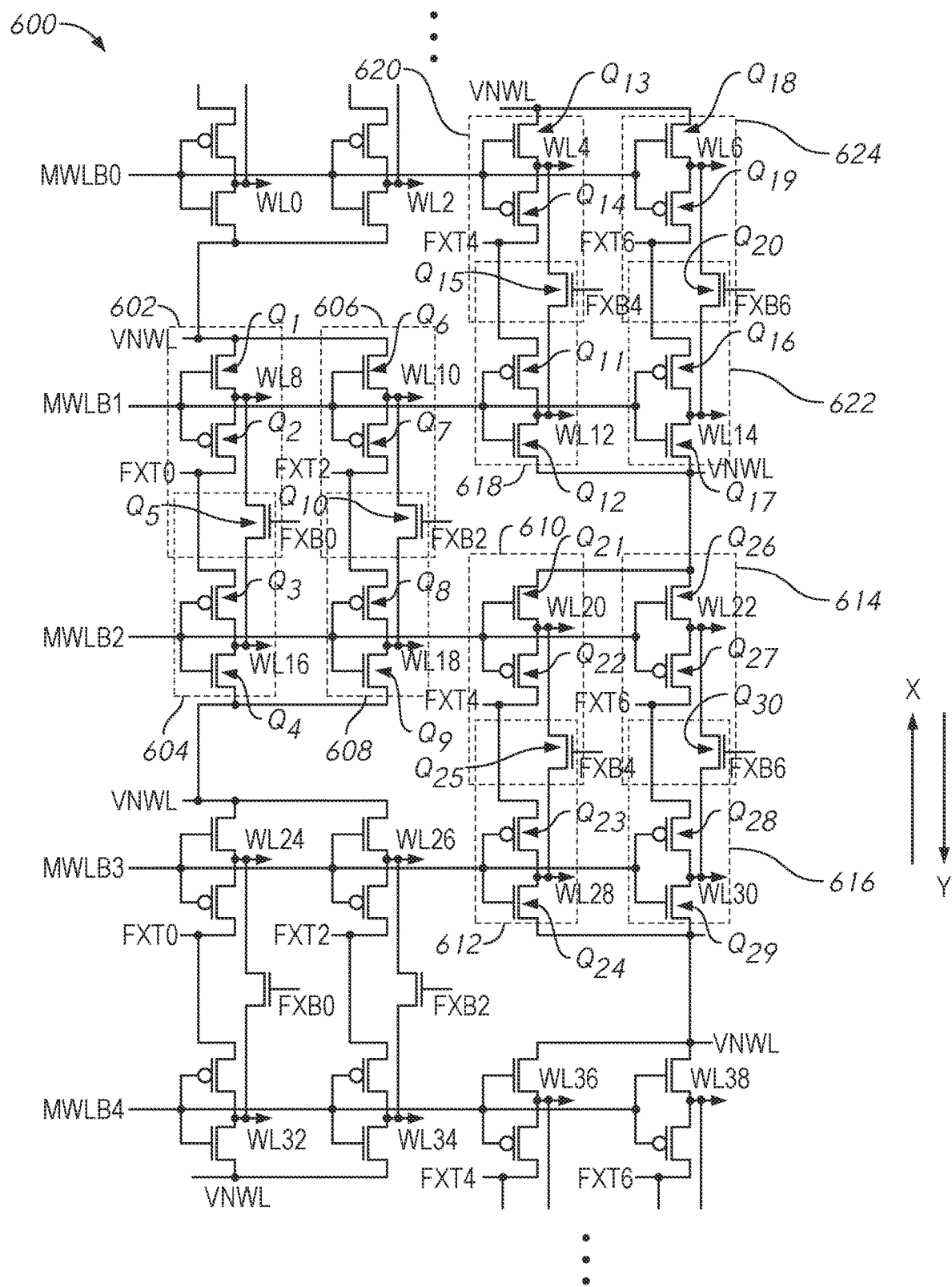
FIG. 6 is a schematic diagram of example subword driver arrays coupled in cascade connections according to some examples described in the disclosure.

FIG. 6 is a schematic diagram of example subword driver arrays coupled in cascade connections according to some examples described in the disclosure. A subword driver array 600 may be implemented in any of the subword drivers (e.g., 42 in FIG. 1, SWD0-7 in FIG. 3). The subword driver array 600 may include multiple main word lines (e.g., MWLB0, MWLB1, . . . ) each coupled to a respective set of subword drivers to drive the set of subword drivers to drive respective word lines. For example, subword drivers 602, 606, 618 and 622 are coupled to and driven by main word line MWLB1. Subword drivers 604, 608, 610 and 614 are coupled to and driven by main word line MWLB2.

In some examples, the subword driver array 600 may include multiple pairs of subword drivers that are coupled in cascade connection as shown in the example in FIG. 5. In some configurations, subword drivers associated with a first main word line may be coupled in cascade connection to subword drivers associated with a second main word line different from the first main word line. For example, the subword drivers 602, 606 are associated with main word line MWLB1 and have outputs coupled to word lines WL8 and WL10, respectively. The subword drivers 604, 608 are associated with a different main word line, MWLB2 and have outputs coupled to word lines WL16 and WL18, respectively.

In the example as shown, the two subword drivers 602, 606 are respectively coupled to two subword drivers 604, 608 in cascade connection. For example, an output of subword driver 602 and an output of subword driver 604 are coupled in a cascaded connection by a common transistor Q5. Thus, subword drivers 602, 604 form a pair as similarly configured in FIG. 5, where the outputs of the subword drivers 602, 604 are coupled to word lines WL8 and WL16, respectively. Similarly, an output of subword driver 605 and an output of subword driver 608 are coupled in a cascaded connection by a common transistor Q10. Thus, subword drivers 606, 608 form a pair as similarly shown in FIG. 5, where output of the subword drivers 606, 608 are coupled to word lines WL10 and WL18, respectively.

In some examples, two subword drivers associated with physically adjacent main word lines may be coupled in cascade connection. For example, where the two subword drivers 602 and 604 are coupled in cascade connection, the associated main word lines of the subword drivers, e.g., MWLB1 and MWLB2, may be physically adjacent to each other. It is appreciated that associated main word lines of two subword drivers that are coupled in cascade connection may not be physically adjacent to each other in some embodiments of the disclosure.

In some examples, subword drivers associated with a given main word line may be coupled in cascade connection with subword drivers associated with two other main word lines in an alternating manner. In a non-limiting configuration, the subword drivers associated with a first main word line may include at least a first set of subword drivers and a second set of subword drivers. The first set of subword drivers may be coupled in cascade connection to one or more subword drivers associated with a second main word line, and the second set of subword drivers may be coupled in cascade connection to one or more subword drivers associated with a third main word line.

In a non-limiting example, the subword drivers associated with a main word line, e.g., MWLB1 may include a first set, e.g., 602, 606, and a second set, e.g., 618, 622. As described above, subword drivers 602, 606 may be coupled in cascade connection with subword drivers 604, 608, respectively, where subword drivers 604, 608 are associated with a second main word line, e.g., MWLB2. Further shown in FIG. 6, the second set of subword drivers 618, 622 may be coupled in cascade connection with subword drivers 620, 624 which are associated with a third main word line, e.g., MWLB0. In this configuration, among the multiple subword drivers associated with the word line MWLB1, two subword drivers 602, 606 are coupled in cascade connection with two subword drivers 604, 608, respectively, that are positioned in a first direction (e.g., in the Y direction) relative to the subword drivers 602, 606, where subword drivers 604, 608 are associated with a second word line, e.g., MWLB2. Two other subword drives associated with the word line MWLB1, e.g., 618, 622 are coupled in cascade connection with two subword drivers 620, 624, respectively, that are positioned in a second direction (e.g., in the X direction) relative to the subword drivers 618, 622, where the subword drivers 620, 624 are associated with a third word line, e.g., MWLB0.

In a similar configuration, two subword drivers 604, 608 associated with the main word line MWLB2 are respectively coupled in cascade connection with two subword drivers 602, 606 that are positioned in the second direction relative to the subword drivers 604, 608, where subword drivers 602, 606 are associated with the main word line MWLB1. Similarly, two other subword drivers associated with the main word line MWLB2, e.g., subword drivers 610, 614, are each coupled in cascade connection with two subword drivers 612 and 616, respectively, that are positioned in the first direction relative to the subword drivers 610, 614, where subword drivers 612, 616 are associated with a fourth main word line, e.g., MWLB3.

In the example in FIG. 6, the first main word line (e.g., MWLB1) may be physically adjacent to the second main word line (e.g., MWLB2). The first main word line (e.g., MWLB1) may also be physically adjacent to the third main word line (e.g., MWLB0). In other scenarios, the first main word line may not be physically adjacent to either of the second or third main word line. It is appreciated that the terms "first direction" and "second direction" are only opposite relatively. For example, the "first direction" may refer to a connection in the X direction whereas the "second direction" may refer to a connection in the Y direction opposite to the X direction. Alternatively, the "first direction" may refer to a connection in the X direction whereas the "second direction" may refer to a connection in Y direction. It is further appreciated that variations of the configurations shown in FIG. 6 may be possible.

Figure 7:
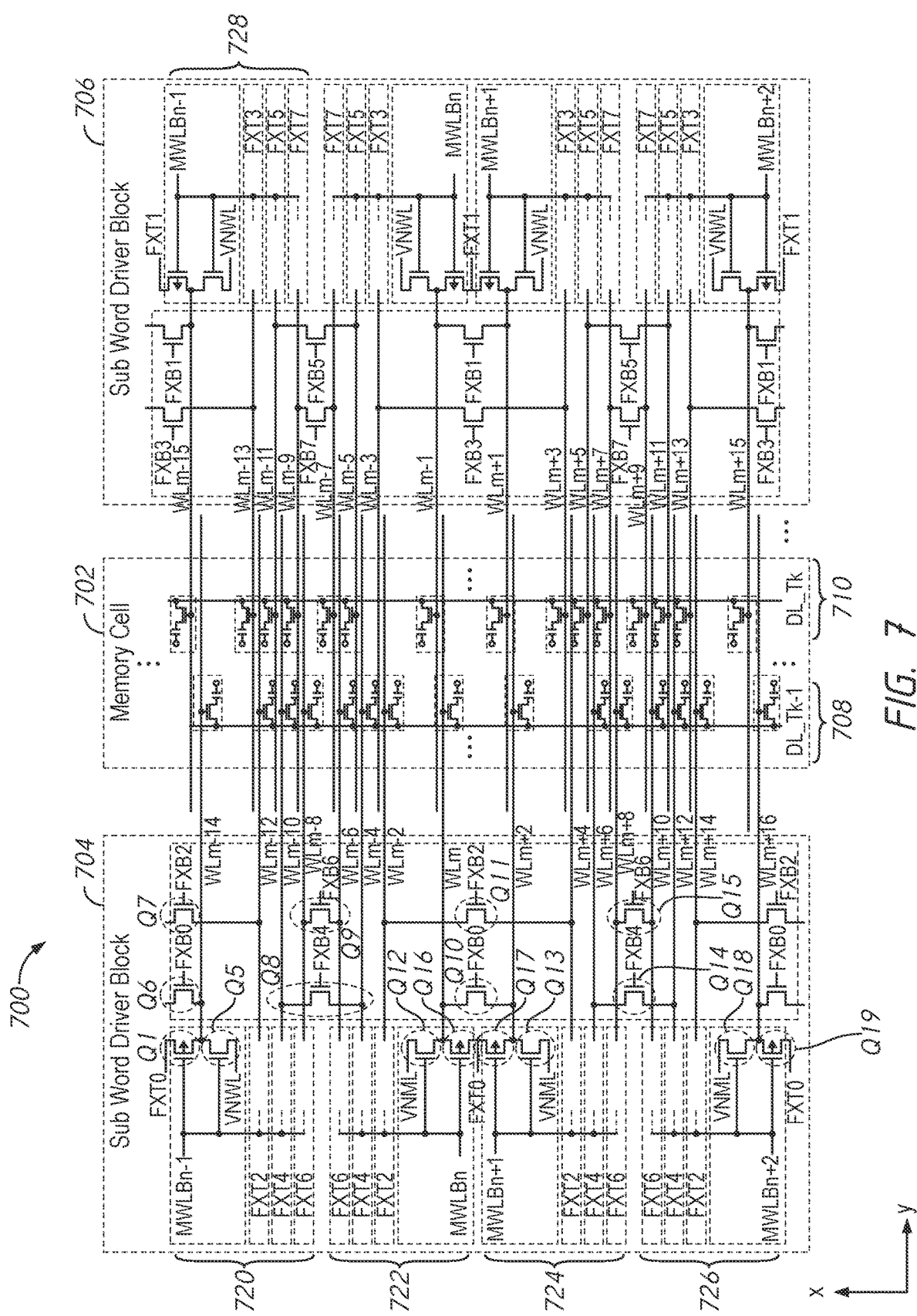
FIG. 7 is a schematic diagram of example subword driver arrays coupled in cascade connections and memory cells according to some examples described in the disclosure.

FIG. 7 is a schematic diagram of example subword driver arrays coupled in cascade connections and memory cells according to some examples described in the disclosure. In some examples, the cascade connection of subword drivers as shown in FIGS. 5 and 6 may be implemented in the subword driver arrays in a memory device 700 in FIG. 7. For example, the memory device 700 may include a memory cell block 702 arranged in two arrays 708, 710 each extending in a first direction, e.g., "x." Each of the memory cell arrays 708, 710 includes a respective data line (e.g., DL_Tk−1, DL_Tk) and multiple memory cells coupled to the respective data line. Each memory cell on a data line is provided with a respective word line extending in a second direction perpendicular to the first direction, e.g., "y," where each word line is driven by a respective subword driver in either side of the memory cell block 702. The memory cell block 702 may include a DRAM memory array. A memory cell in the memory cell block 702 may include a capacitor and a transistor (e.g., an n-channel type MOSFET) serially connected and configured to store one bit of data.

In a non-limiting example, the memory cells associated with even-numbered word lines (e.g., WLm−14, WLm−12, . . . WLm, WLm+14, WLm+16) are coupled to a first data line (e.g., DL_Tk−1), where the even-numbered word lines are coupled to a first subdriver block 704 positioned on a first side (e.g., the left side) of the memory cell block 702. Similarly, the memory cells associated with odd-numbered word lines (e.g., WLm−15, WLm−13, . . . WLm−1, WLm+1, . . . WLm+13, WLm+15) are coupled to a second data line (e.g., DL_Tk), where the odd-numbered word lines are coupled to a second subdriver block 706 positioned on a second side opposite the first side (e.g., the right side) of the memory cell block 702.

In the configuration in FIG. 7, the first subword driver block 704 may include multiple sets of subword drivers to drive respective even-numbered word lines, e.g., WLm−14, WLm−12, . . . Each of the word lines is coupled to a respective memory cell. Each set of subword drivers are associated with a respective main word line. For example, a set of even-numbered subword drivers 720 (not entirely shown) are coupled to even-numbered word lines WLm−14, WLm−12, WLm−10 and WLm−8 associated with the main word line MWLBn−1. Similarly, a set of odd-numbered subword drivers 728 (not entirely shown) are coupled to odd-numbered word lines WLm−15, WLm−13, WLm−11 and WLm−9 associated with the same main word line MWLBn−1. The subword driver sets 720 and 728 are respectively arranged on two opposite sides of the memory cell block 702. In the configuration in FIG. 7, a main word line drives eight subword drivers to drive eight word lines. Each of the eight subword drivers is coupled to a main word line and a respective word driver line (FXT, FXB). For example, the signals provided on main word line MWLBn−1 and eight word driver lines FXT0-7 drive eight subword drivers (on either side of the memory cell block 702), respectively. Each of the eight subword drivers drives a respective word line (e.g., WLM−8, WLM−9, . . . WLM−15).

With further reference to FIG. 7, the even-numbered subword drivers on the left side of the memory cell block 702 are driven by the main word line MWLBm−1 and word driver lines signals FXT0/FXB0, FXT2/FXB2, FXT4/FXB4, and FXT6/FXB6, respectively, to drive the word lines WLm−14, WLm−10, and WLm−8, respectively. On the right side of the memory cell block 702, the odd-numbered subword drivers are driven by the main word line MWLBm−1 and word driver lines FXT1/FXB1, FXT3/

FXB3, FXT5/FXB5, and FXT7/FXB7, respectively, to drive the word lines WLm−15, WLm−13, WLm−11, and WLm−9, respectively.

The remaining blocks in the circuit are arranged in a similar manner and will not be described repeatedly. Although only main word lines MWLBn−1, MWLBn, MWLBn+1, MWLBn+2 are shown in FIG. 7, it is understood that a memory device may have hundreds of main word lines, and each main word line may be coupled to any suitable number of subword drivers to drive multiple word lines. For example, in a non-limiting example, a memory device may have 128 main word lines driven by 128 main word drivers (MWD). A main word line may be associated with 8 word lines, which are selected together by the signals on the main word line and respective word driver lines FXT/B0-FXT/B7. In such case, there are 1024 word lines in the memory cell array.

With further reference to FIG. 7, the cascade connection between subword drivers may be implemented. For example, on the left side of the memory cell array 702, the word lines WLm−4 and WLm−6 are driven by respective subword drivers associated with the main word line MWLBn. (see block 722); the word line WLm−10 and WLm−8 are driven by respective subword drivers associated with adjacent main word line MWLBn−1 (see block 720). As shown, the subword drivers that drive word lines WLm−4 and WLm−10, which are associated with adjacent main word lines MWLBn and MWLBn−1, respectively, each includes a common n-channel type transistor Q8 that is coupled in cascade connection to the outputs of the subword drivers. Respective subword drivers of the word lines WLm−4 and WLm−10 are also coupled to the same word driver line FXT4. The gate of the transistor Q8 is coupled to the word driver line FXB4.

Similarly, the subword drivers that drive word lines WLm−6 and WLm−8 are coupled in cascade connection through a common n-channel type transistor Q9. Respective subword drivers of the word lines WLm−6 and WLm−8 are also coupled to the same word driver line FXT6. The transistor Q9 is coupled to the word driver line FXB6. For each of the subword drivers (or subword driver pairs in cascade connection), the detailed illustration is shown in FIGS. 5 and 6. The multiple odd-numbered subword drivers (in block 706) are also coupled in cascade connection in the same manner as for even-numbered subword drivers (in block 704) as previously described.

Figure 8:
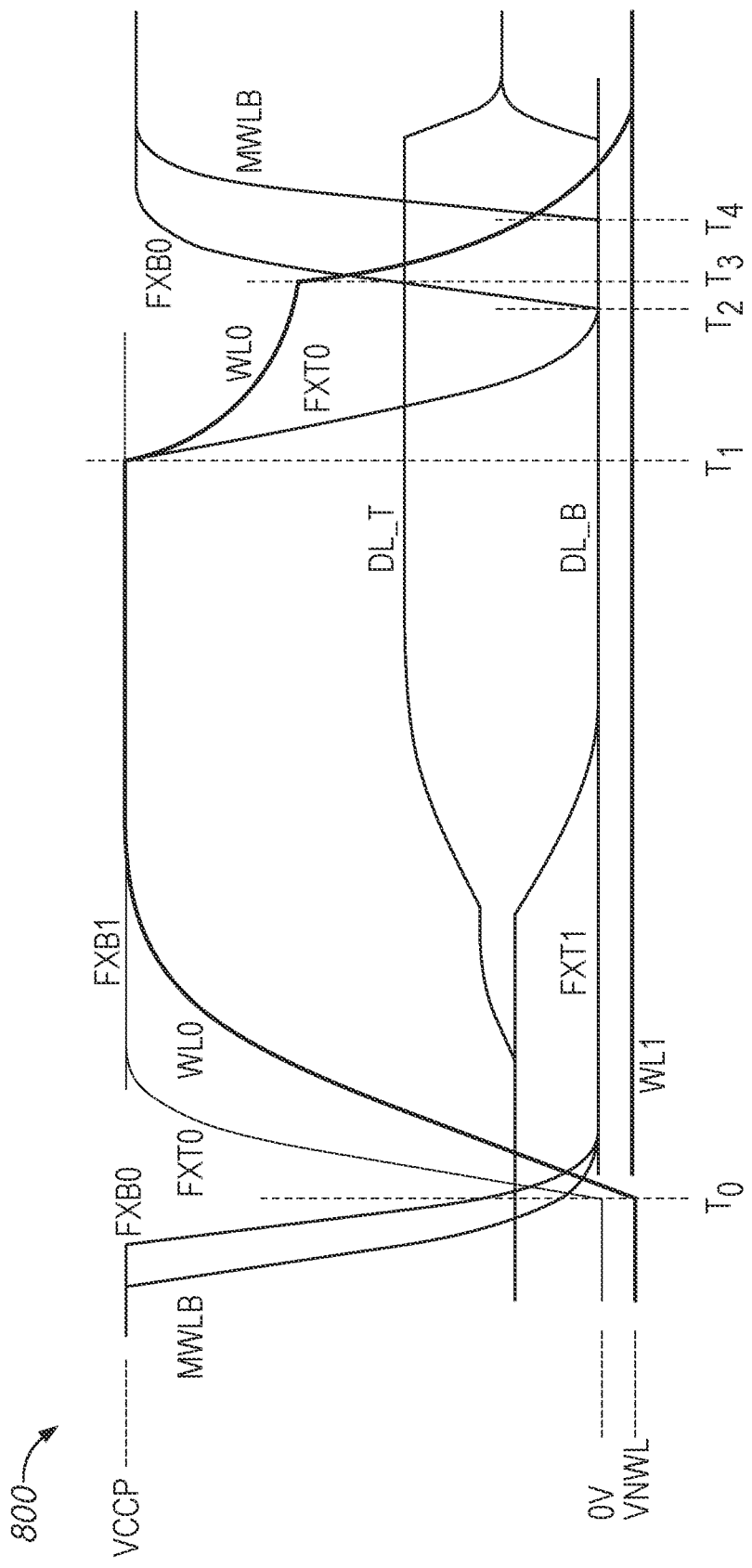
FIG. 8 is a timing diagram of various signals in an operation of an example subword driver according to an embodiment in the disclosure.

FIG. 8 is a timing diagram of various signals in an operation of an example subword driver according to an embodiment in the disclosure. In some examples, timing diagram 800 shows the operation of a subword driver during a memory access operation (e.g., activation). For example, the subword drivers 502, 504 of FIG. 5 may be operated according to the example operation of timing diagram 800. However, the example of FIG. 8 is not limited to any specific configuration of the subword drivers in FIG. 5.

Timing diagram 800 shows the states of main word line MWLB, the word driver lines FXT0, FXB0, and the word line WL0. The state on the main word line MWLB may be active low and the main word line MWLB may be driven by a respective main word driver, e.g., MWD in FIGS. 1-3. Word driver lines FXT and FXB may be driven by a word driver FXD, such as a word driver shown in FIGS. 1-3. In some examples, as an illustration, the timing diagram 800 will be described with reference to the subword driver 502 of FIG. 5. For example, the MWLB in the timing chart 800 may correspond to the main word line MWLBn in FIG. 5; FXT0, FXB0 may correspond to FXT0, FXB0 in FIG. 5 respectively. WL0 may correspond to the word line WLm and provided by the subword driver 502 in FIG. 5. FXT1, FXB1 and WL1 may correspond to the driver/word lines of another subword driver associated with MWLBn (e.g., one of the additional subword drivers 520).

At some time before T0, an activation signal ACT may be received by a row decoder circuit (e.g., 12 in FIG. 1). An address signal may be provided to the memory device with the ACT signal to select a main word driver and a subword driver for activation. For example, the main word line MWLB may transition to an active state (e.g., a low potential VSS in the example shown in FIG. 8), the state on the word driver line FXT0 may become active high, and the word driver line FXB0 may become active low. At or around time T0, referring to FIG. 5, selected word line WLm may be driven to an active state (e.g., a high potential VCCP) responsive to the activation of MWLBn, FXT0, and FXB0. For example, transistor 508 in the subword driver 502 may be active and transistors 506 and 514 in the subword driver 502 may be inactive to drive the selected word line WLm (shown as WL0 in FIG. 8). The word line WLm may be coupled to the VCCP of word driver line FXT0 via transistor 508. During such time, the memory cells (not shown) selected by the word line WL0 may be accessed.

At or around time T1, a precharge command may be received by the memory device. In response, an internal precharge signal PRE (not shown in FIG. 8) may transition to an active state. Responsive, at least in part to the precharge signal PRE, the word driver associated with FXT0 may be deactivated, and the word driver line FXT0 may be decoupled from the VCCP. As the potential on the FXT0 line decreases, the state of the main word line MWLB is still low. The word line WL is pulled down by the p-channel type transistor 508 to a lower voltage so the potential on the WL line decreases.

At or around time T2, the word driver line FXB0 may be inactive and becomes high. This causes the n-channel type transistor 514 to turn on and pull down the potential on the word line WL faster toward the non-active potential VNWL at or around time T3. This is possible because the common transistor 514 is coupled to the subword driver 504 associated with a different main word line MWLBn+1. At this time, the main word line MWLBn coupled to the subword driver 502 is still active (e.g., at logic low), while other main word lines, such as MWLBn+1, are unselected (e.g., at logic high). As such, the n-channel type transistor 512 in the subword driver 504 is turned on to couple the non-active potential VNWL to the drain/source of the common transistor 514.

At or around time T4, the main word line MWLB becomes inactive and the potential on MWLB increases. This causes the p-channel type transistor 508 to turn off and the n-channel type transistor 506 to turn on, which further helps to pull down the potential at the output OUTm of the subword driver 502 to the non-active potential VNWL.

Note the word line WL becomes deactivated after time T1, and the potential on the word line WL decreases at a faster rate at an intermediate voltage (e.g., a mid-point at T3) during a limited pre-charge time. This is facilitated by the common transistor 514. The operation of reducing the voltage of the word line WL0 by decreasing FXT0 during the pre-charge at the intermediate point mitigates a row hammer issue that might occur in a memory device. Further, this operation reduces the voltage difference across the source/drain (VDS) for the n-channel type transistor 506. This may prevent deterioration of the transistor due to hot carriers, thus, improve the reliability of the subword driver.

The timing diagram 800 will be the same for the subword driver 504 of FIG. 5 when memory cells coupled to the word line WLm+1 are accessed. In such case, the MWLB in the timing chart 800 may correspond to the main word line MWLBn+1 in FIG. 5, FXT0, FXB0 may correspond FXT0, FXB0 in FIG. 5 respectively. WL0 may correspond to the word line WLm+1 and may be driven by the subword driver 504 in FIG. 5. FXT1, FXB1 and WL1 may correspond to the word driver lines and word line of another subword driver associated with MWLBn+1 (not shown in FIG. 5). The operation of the subword driver 504 is the same as that of the subword driver 502 and will not be repeated, with the exception that the subword driver 504 is driven by a different main word line MWLBn+1. Further, at time T3 when the word line WL0 (e.g., word line WLm+1) is driven to the intermediate voltage, the common transistor 514 will be turned on to drive the word line WL0 faster toward the non-active potential VNWL. This is facilitated by the n-channel type transistor 506 of the subword driver 502, which is turned on (by an inactive main word line MWLBn) to couple the VNWL to the drain/source of the common transistor 514.

As described above, the common transistor 514 that couples the outputs of two subword drivers 502, 504 in cascade connection may allow the current to flow bi-directionally depending on which subword driver is activated. If subword driver 502 is activated (e.g., responsive to an active main word line) and the subword driver 504 is deactivated, the current in the common transistor 514 may flow from the activated subword driver 502 to the deactivated subword driver 504 to cause the word line potential of the activated word line WLm (coupled to the output OUTm of subword driver 502) to be pulled down to the non-active potential VNWL during pre-charge. Conversely, if subword driver 504 is activated and subword driver 502 is deactivated, the current in the common transistor may flow from the activated subword driver 504 to the deactivated subword driver 502 to cause the word line potential of the activated word line WLm+1 (coupled to the output OUTm+1 of subword driver 504) to be pulled down to the non-active potential VNWL during precharge.

Figure 9:
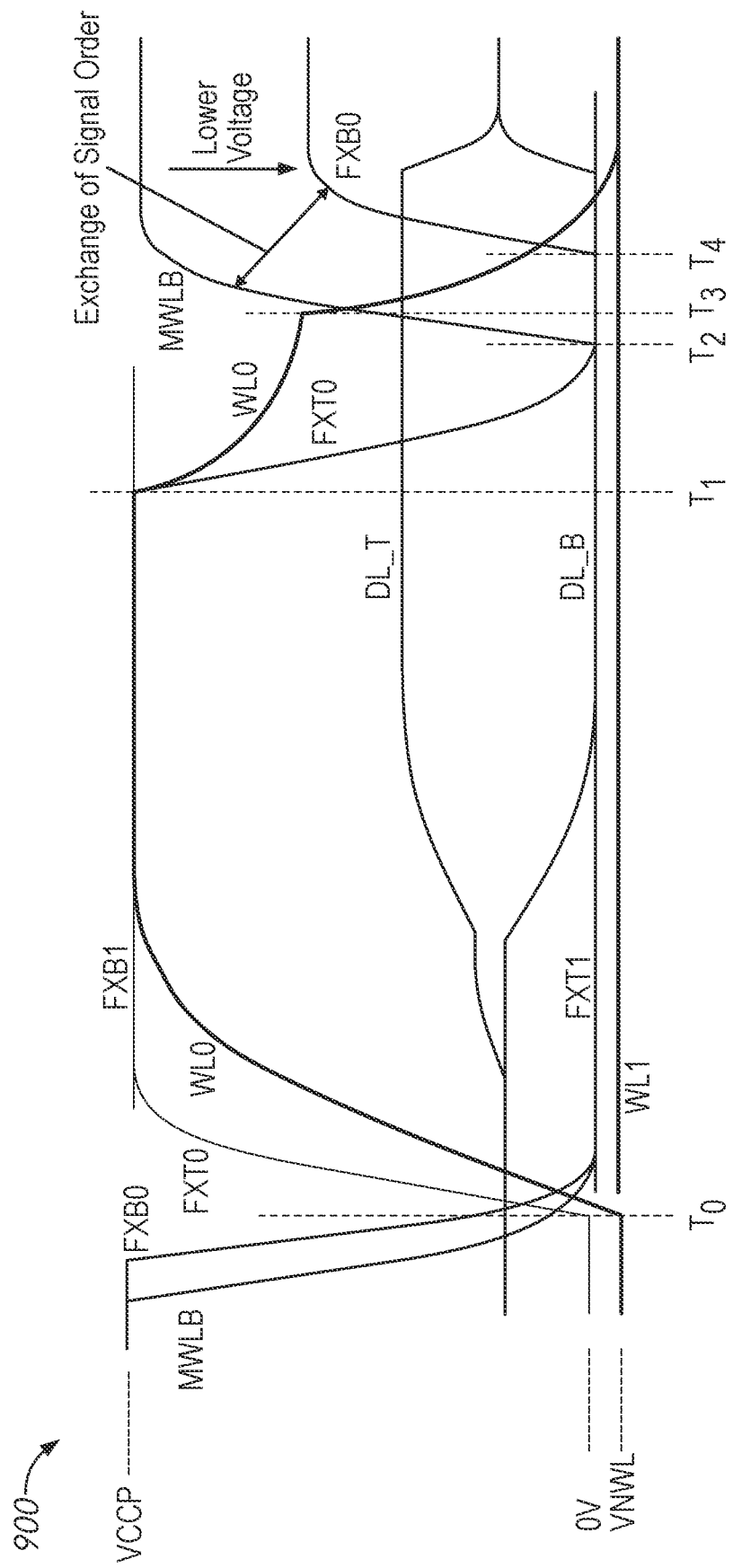
FIG. 9 is a timing diagram of various signals in an operation of an example subword driver according to an embodiment in the disclosure.

FIG. 9 is a timing diagram of various signals in an operation of an example subword driver according to an embodiment in the disclosure. In some examples, timing diagram 900 shows the operation of a subword driver during a memory access operation (e.g., activation). The subword drivers 502, 504 of FIG. 5 may be operated according to the example operation of timing diagram 900. However, the example of FIG. 9 is not limited to the specific configuration of the subword drivers in FIG. 5.

In some examples, the timing diagram 900 is the same as the timing diagram 800, except in the precharge period. Now, the pre-charge operation in the timing diagram 900 is further described with reference to the subdriver circuit 502 in FIG. 5. In such case, the MWLB in the timing chart 900 may correspond to the main word line MWLBn in FIG. 5; FXT0, FXB0 may correspond FXT0, FXB0 in FIG. 5 respectively. WL0 may correspond to the word line WLm in FIG. 5 driven by the subword driver 502. FXT1, FXB1 and WL1 may correspond to the word driver lines and word line of another subword driver associated with MWLBn (e.g., one of the additional subword drivers 520).

During the precharge, at or around time T2, instead of deactivating the word driver line FXB0 first (as in FIG. 8), the main word line MWLB (corresponding to MWLBn in FIG. 5) may be deactivated at the same time or before the word driver line FXB0 is deactivated. For example, MWLB becomes deactivated and the potential on the MWLB increases at or around time T2, whereas the FXB0 becomes deactivated and the potential on the FXB0 increases at or around time T4, subsequent to time T2.

With further reference to FIGS. 9 and 5, deactivating the main word line MWLBn sooner than deactivating the word driver line FXB0 may turn on the n-channel type transistor 506 sooner, causing the potential on the output of the subword driver 502 (coupled to the word line WLm) to be pulled down faster. This makes it possible to have the amplitude of the signal on the FXB0 at a voltage lower than the high potential of the main word line MWLB. For example, in a word driver FXD associated with the FXB0, the high potential of FXB0 is set to have a lower amplitude than VCCP. This reduction of amplitude in FXB0 results in a reduction in power consumption.

It is to be noted that the driving ability of the word driver line FXB0 pulling down the word line WL0 during pre-charge may be reduced as a result of reduced amplitude. Further, the driving ability of FXB0 may also be reduced because the common transistor 514 is now connected to the n-channel type transistor 512 of the subword driver 504 of the adjacent main word line MWLBn+1. In other words, two transistors (e.g., 512, 514) need to be turned on in order to pull down the word line WLm to VNWL. However, this reduction of driving ability may be mitigated by deactivating the main word line MWLB of the subword driver sooner, as described in FIG. 9. The degree of the reduction of the amplitude in FXB0 may depend on the precharge time margin. For example, a wider precharge time margin may allow a lower amplitude to be provided to the FXB0 signal. In a non-limiting example, the VCCP may be set at 3.1V, whereas the amplitude of the FXB0 may be set to 1.2V.

Returning to FIGS. 6 and 7, the operation of the subword drivers 502, 504 in FIG. 5 and the timing diagrams in FIGS. 8 and 9 may also be implemented in any of the subword drivers in FIGS. 6 and 7. For example, among the multiple main word lines MWLB, only one main word line is selected (e.g., active) whereas all other main word lines are unselected (e.g., inactive). Also, among the multiple word driver lines FXT/FXB, only one word driver line is active. For a subword driver associated with a selected main word line, the supply of non-active potential VNWL from its own circuit is cut off because the n-channel type transistor is turned off (due to the active selected main word line). If the FXT provided to the subword driver is inactive, however, a non-potential VNWL is nonetheless supplied to the word line to prevent the word line from floating. For example, the VNWL may be supplied from another subword driver that is in cascade connection through a common transistor.

For example, with reference to FIG. 6, one main word line, e.g., MWLB1 may be selected (e.g., at logic low) while other main word lines are unselected (e.g., at logic high); and one word driver line, e.g., FXT0/FXB0 may be active while other word driver lines are inactive. In this case, all of the subword drivers 602, 606, 618, 622 are cut off from VNWL in their respective own circuit due to selected main word line MWLB1. When FXT2/FXB2, FXT4/FXB4, FXT6/FXB6 are inactive, the VNWL supply for the corresponding subword drivers 606, 618, 612 are provided to their adjacent subword drivers through the cascade connection. For example, the VNWL is supplied to subword driver 606 from subword driver 608, which is associated with the unselected main word line MWLB2. When MWLB2 is unselected, the transistor Q9 in subword driver 608 is turned on, and VNWL is coupled to the common transistor Q10 through transistor Q9. Similarly, the VNWL supplies for subword drivers 618, 612 are provided from subword drivers 620 and 624, respectively.

Figure 10:
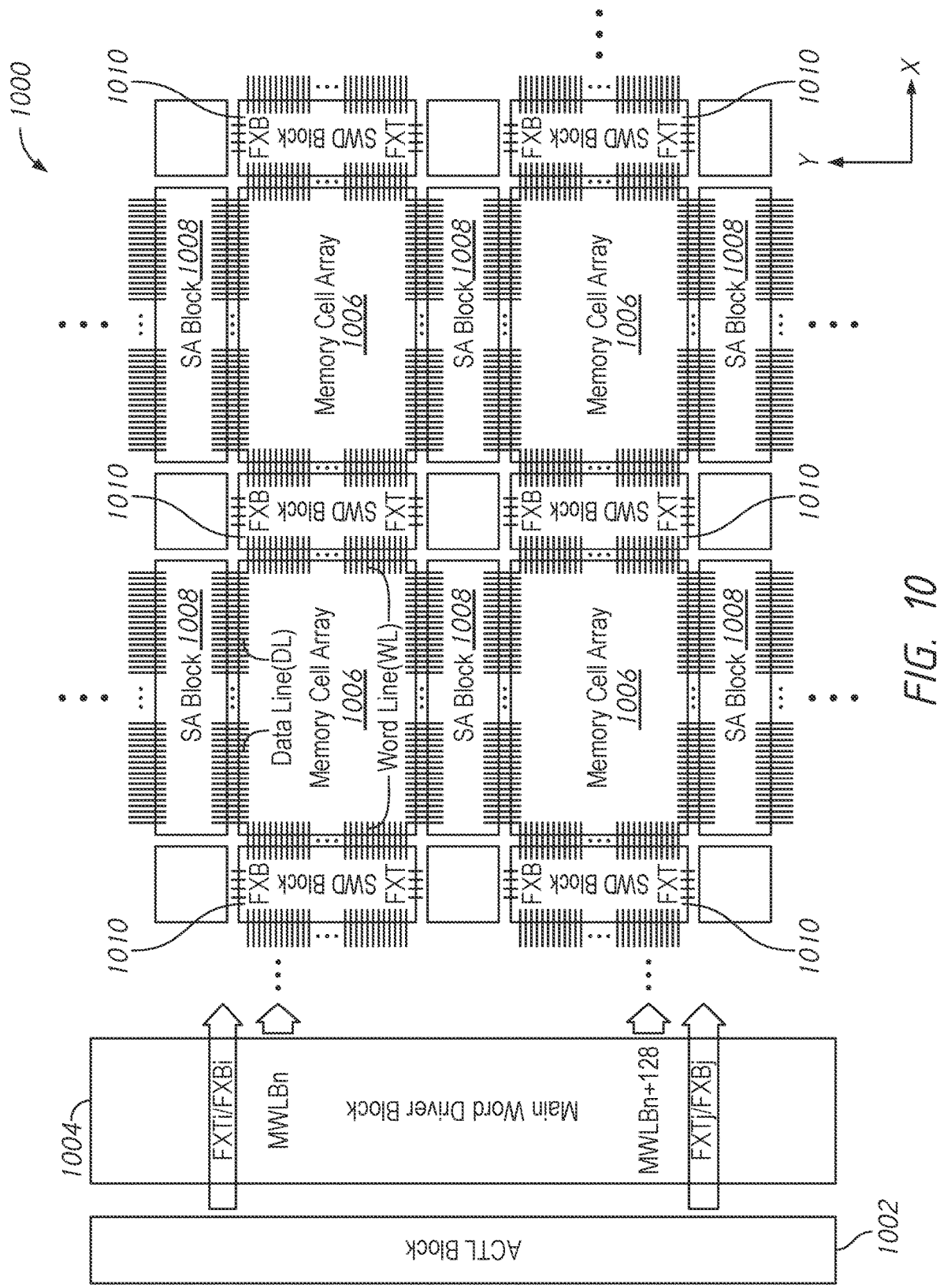
FIG. 10 is an example block diagram of a portion of a memory device according to some examples described in the disclosure.

FIG. 10 is an example block diagram of a portion of a memory device according to some examples described in the disclosure. In some examples, a portion of a memory device, e.g., 1000, may be implemented in the memory device 10 (FIG. 1). The portion of the memory device 1000 may include multiple memory cell arrays, e.g., 1006. The memory cell arrays 1006 may be arranged in rows and columns. Each memory cell array 1006 may include multiple memory cells. The portion of the memory device 1000 also includes multiple subword driver (SWD) blocks 1010 and multiple sense amplifier (SA) blocks 1008. In some examples, the memory cell arrays 1006, SWD blocks 1010 and SA blocks 1008 may be implemented inside a memory cell array 11 (FIG. 1).

In some examples, the SWD blocks 1010 are arranged on the sides of the memory cell array 1006. In a non-limiting example, subword drivers may be placed on one side of a memory cell array and adjacent to the memory cell array to provide signals on respective word lines for the memory cell array. In another non-limiting example, subword drivers may be placed on two sides of a memory cell array and adjacent to the memory cell array to provide signals on respective word lines for the memory cell army. For example, the word lines for a memory cell array may be divided into even- and odd-numbered word lines. The subword drivers for even-numbered word lines may be arranged adjacent to a first side, e.g., left side of the memory cell array, whereas subword drivers for odd-numbered word lines may be arranged adjacent to a second side opposite the first side (e.g., right side) of the memory cell array.

In the example in FIG. 10, each of the SWD blocks may serve an adjacent memory cell array on either side of the SWD block. Each of the SWD blocks may serve adjacent memory cell arrays on both sides of the SWD block. For example, a SWD block may have a first portion and a second portion, where the first portion is coupled to word lines of a memory cell array adjacent to a first side (e.g., left side) of the SWD block, and the second portion is coupled to word lines of a memory cell array adjacent to a second side opposite the first side (e.g., right side) of the SWD block.

In some examples, the subword driver blocks (1010) may be placed on sides of the memory cell arrays (1006) in a first direction, e.g., X, whereas the SA blocks 1008 may be arranged on sides of the memory cell arrays 1006 in a second direction perpendicular to the first direction, e.g., Y. For example, as shown in FIG. 10, the SWD blocks may be arranged adjacent left and/or right sides of the memory cell blocks 1006, and SA blocks may be arranged adjacent upper and/or lower sides of the memory cell blocks 1006.

The portion of the memory device 1000 may further include a main word driver (MWD) block 1004. In some examples, the MWD block may include multiple MWDs coupled to multiple main word lines, respectively. In a non-limiting, the MWD block may include 128 MWDs to provide signals on 128 main word lines, e.g., MWLBn to MWLBn+128, respectively. It is appreciated that other suitable number of main word lines may be implemented.

In some examples, the portion of the memory device 1000 may also include an array control block (ACTL) 1002 configured to provide signals on multiple word driver lines FXTj/FXBj to the SA blocks 1010. In some examples, the MWD block 1004 may be implemented inside the memory device 10 (FIG. 1). In some examples, the ACTL block 1002 may be implemented in one or more row decoder circuits 12 (FIG. 1) and/or additional circuits in the memory device 10 (FIG. 1). The portion of the memory device 1000 may operate the same as memory device 10 (FIG. 1), 600 (FIG. 6), or 700 (FIG. 7), thus, the operation of the memory device shown in FIG. 10 is not repeated.

Figure 11A:
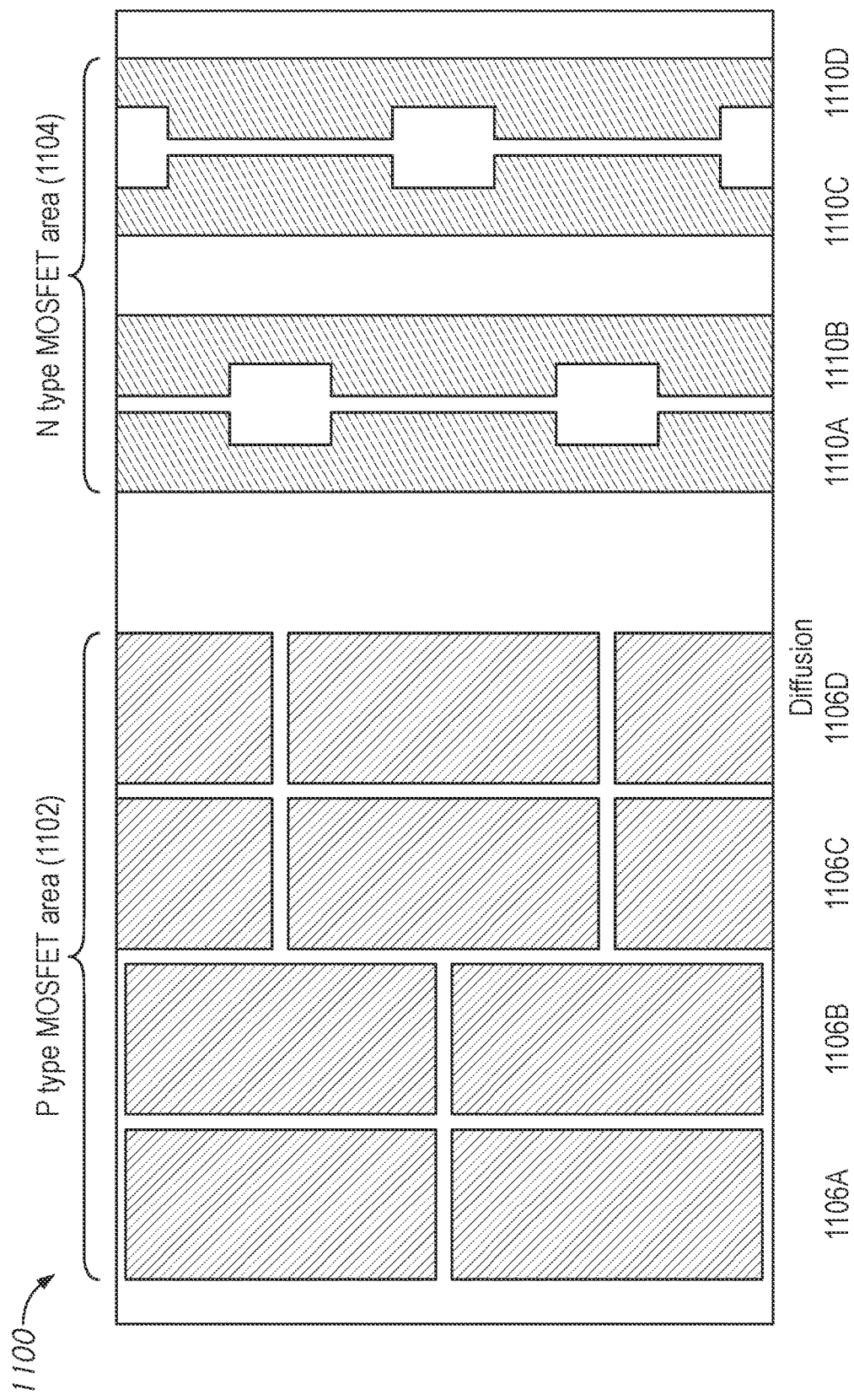
FIG. 11A is a plan view of an example layout diagram of subword drivers showing active regions according to some examples described in the disclosure.

FIG. 11A is a plan view of an example layout diagram of subword drivers showing active regions according to some examples described in the disclosure. In some examples, layout 1100 of subword drivers may include active regions that implement multiple subword drivers, such as subword drivers in the memory device 700 (FIG. 7). An active region may include one or more drains, sources and channels. For example, an active region may include P+ diffusion materials or N+ diffusion materials to form p-channel type or n-channel type transistors, respectively. With reference to FIG. 11A, the layout 1100 may include a p-channel type MOSFET area 1102 and an n-channel type MOSFET area 1104 adjacent to the p-channel type area. The p-channel type area 1102 may include active regions having P+ diffusion materials and implement p-channel type transistors in the subword drivers. The n-channel type area 1104 may include active regions having N+ diffusion materials and implement n-channel type transistors in subword drivers. As shown in FIG. 11A, the p-channel type area has multiple sub-regions, e.g., 1106A-D, each extending in a first direction such as in columns. The n-channel type area has multiple sub-regions, e.g., 1110A-D, each extending in the first direction. It is appreciated that, although only four sub-regions are shown, both the p-channel type area and n-channel type area may have any suitable number of sub-regions. Separating the n-channel and p-channel type transistors in the subword drivers may provide advantages in optimizing the layout as will be further illustrated in the present disclosure.

Figure 11B:
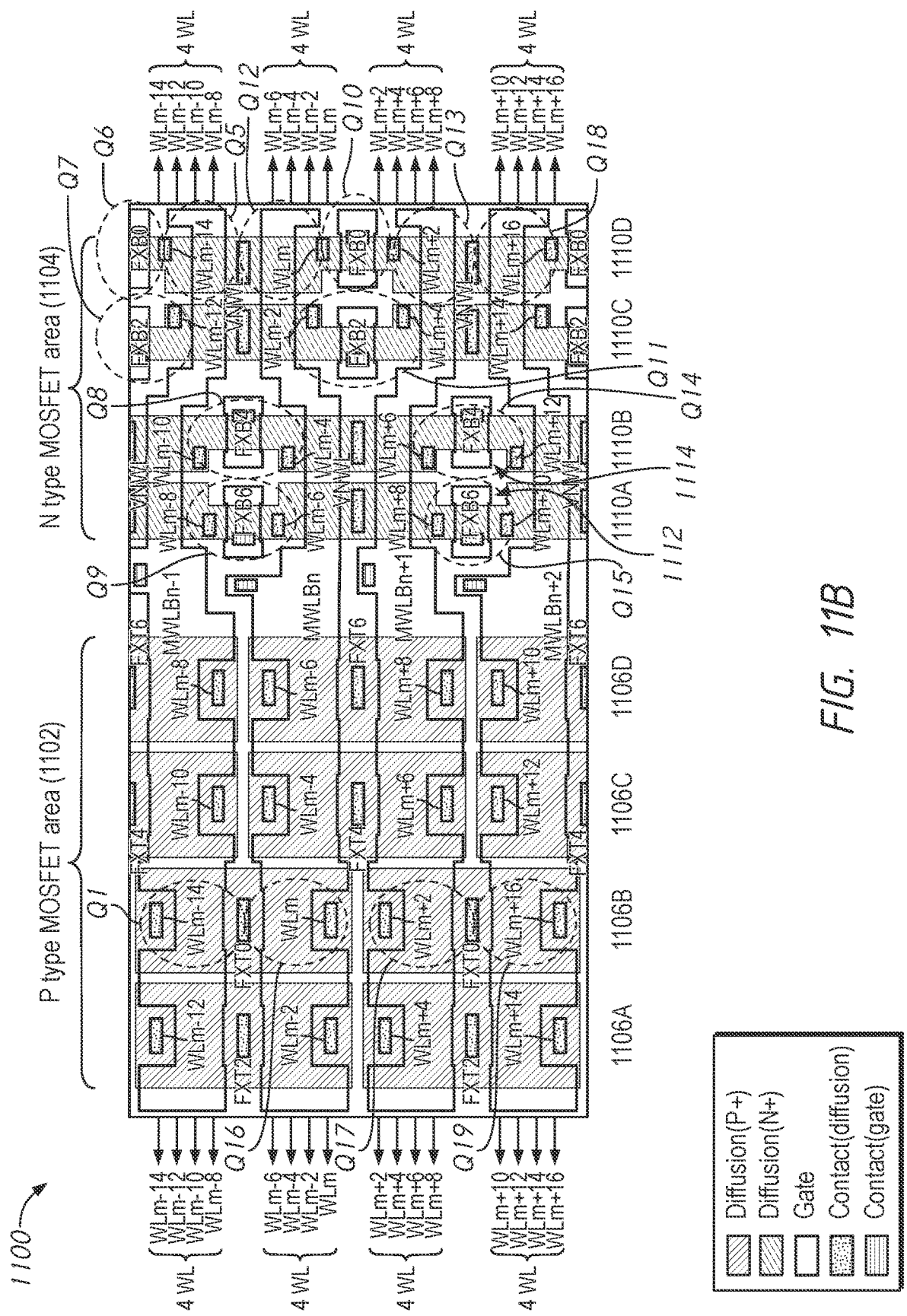
FIG. 11B is a plan view of an example layout diagram of the subword drivers in FIG. 11A showing additional layers according to some examples described in the disclosure.

FIG. 11B is a plan view of an example layout diagram of the subword drivers in FIG. 11A showing additional layers according to some examples described in the disclosure. In some examples, layout 1100 may include additional layers such as a gate layer overlaid on the p-channel type area 1102 and n-channel type area 1104 to form p-channel type or n-channel type transistors. In some examples, the gate layer may include multiple gate electrodes. Each gate electrode may be coupled to a respective main word line MWLB. In FIG. 11B, four gate electrodes respectively for main word lines MWLBn−1, MWLBn, MWLBn+1, and MWLBn+2 are shown. Although the layout 1100 shows only a portion of the memory device, it is appreciated that additional gate electrodes for other main word lines may be included.

With further reference to FIG. 11B, the layout 1100 may also include contacts for active regions or gate layers. As shown, diffusion contacts may be arranged in an active region on each side of a gate. In the p-channel type area (1102), gate electrodes may overlap with active regions including P+ diffusion materials to form respective p-channel type transistors. A contact on the active region may be coupled to a word line WLm+j or a word driver line (e.g., FXTj). A FXT word driver line (e.g., FXT0, FXT1, FXT2, FXT3) is connected to a common source/drain between adjacent main word lines (MWLB).

For example, FXT0, FXT2 are coupled to respective common sources/drains between adjacent gate electrodes associated with MWLBn−1 and MWLBn, FXT0, FXT2 are also coupled to respective common sources/drains between adjacent main word lines MWLBn+1 and MWLBn+2. FXT4, FXT6 are coupled to respective common drains/sources between adjacent main word lines MWLBn and MWLBn+1. For each gate, on the opposite side from the common source/drain, a respective word line is coupled to the drain/source. For example, along the gate electrode associated with MWLBn, a word line WLm is coupled to a drain of the transistor Q16, opposite the common source with transistor Q1. Similarly, along the gate electrode associated with main word line MWLBn+1, a word line WLm+2 is coupled to a drain of the transistor Q17, opposite the common source with transistor Q19. This pattern repeats for additional word lines.

In the n-channel type area 1104, the gate electrodes overlay with N+ diffusion sub-regions to form respective n-channel type transistors. A contact on the active region may be coupled to a word line WLm+i or a non-active potential VNWL. In other words, respective word lines and non-active potential VNWL are coupled to the drain/source of each transistor. For example, transistor Q12 is formed and coupled to main word line MWLBn at the gate, and further coupled to VNWL and WLm at the drain/source. Transistor Q18 is formed and coupled to main word line MWLBn+2 at the gate, and further coupled to VNWL and WLm+16 at the drain/source.

With further reference to FIG. 11B, common transistors in subword drivers (e.g., common transistors in FIGS. 5-7) may be formed in the n-channel type area 1104 between two adjacent gate electrodes, where each common transistor may be coupled to respective drains/sources at outputs of different subword drivers, where the outputs are coupled to respective word lines. For example, between the gate electrode MWLBn+1 and adjacent gate electrode MWLBn+2, another gate is disposed overlaying with the N+ diffusion sub-region 1110A to form a common n-channel type transistor. The common n-channel type transistor is coupled to a word driver line at the gate and two drains/sources of different subword drivers. For example, a common transistor Q15 is formed between different drains/sources at outputs of different subword drivers that are coupled to word lines WLm+8 and WLm+10, respectively. The common transistor Q15 may be coupled to the word driver line FXB6 at the gate. Now referring to FIG. 7, transistor Q15 in FIG. 11B also corresponds to transistor Q15 in FIG. 7. Similarly, between adjacent main word lines MWLBn+1 and MWLBn+2, on the N+ diffusion sub-region 1110B, a gate is disposed between drains/sources at outputs of the different subword drivers that are coupled to word lines WLm+6 and WLm+12, respectively, and is coupled to the word driver line FXB4. This forms another common transistor Q14, which is coupled between drains/sources at outputs of different subword drivers that are coupled to word lines WLm+6 and WLm+12, respectively. This transistor corresponds to the transistor Q14 in FIG. 7.

Returning to FIG. 11B, the width of the N+ diffusion sub-regions (e.g., the N+ diffusion sub-region 1110A) may include a portion 1112 at where the gate FXB6 intersects that is narrower than other portions of the sub-region. The narrower portion 1112 may define, at least in part, a recess area to accommodate layout space for the gate FXB6. Similarly, another N+ diffusion sub-region 1110B may also include a portion 1114 at where the gate FXB4 intersects that is narrower than other portions of the sub-region. The narrower portion 1114 may define, at least in part, a recess area to accommodate layout space for the gate FXB4. In the example shown, two recess areas formed by narrow portions 1112 and 1114 in adjacent N+ diffusion sub-regions 1110A, 1110B may be adjacent to each other, allowing the two adjacent N+ diffusion sub-regions to be close to each other, while accommodating the gates for the common transistors Q14, Q15. This facilitates a reduction of layout dimension.

With further reference to FIG. 11B, additional common transistors in the circuit in FIG. 7 may be formed in the n-channel type area 1104, such as Q6, Q7, Q8, Q9, Q10, and Q11. Additionally, other n-channel type transistors in subword drivers may be formed in the n-channel type area 1104, on each gate electrode that is coupled to a respective main word line. For example, an n-channel type transistor Q5 (corresponding to the transistor Q5 in FIG. 7) is formed over the gate electrode associated with main word line MWLBn−1, with drain/source coupled respectively to word line WLm−14 and the non-active potential VNWL, respectively. In another example, an n-channel type transistor Q18 (corresponding to the transistor Q18 in FIG. 7) is formed over the gate electrode associated with main word line MWLBn+2. Additional n-channel type transistors in the subword driver block 704 (FIG. 7) may be formed in the n-channel type area 1104 of the layout 1100 in a similar manner.

In some examples, the n-channel type transistors that are formed over two adjacent gate electrodes may share a common contact. For example, transistor Q5 and transistor Q12 share a common diffusion contact coupled to a non-active potential VNWL. In another example, transistor Q10 and transistor Q12 share a common contact coupled to a corresponding word line (e.g., WLm).

With further reference to FIG. 11B, the p-channel type transistors in the subword driver block 704 may be formed in the p-channel type area 1102 of the layout 1100. For example, p-channel type transistors Q1, Q16, Q17, and Q19 (corresponding to transistors Q1, Q16, Q17, and Q19) may be formed over respective gate electrodes in an P+ diffusion sub-region 1106B. For example, p-channel type transistor Q1 is formed over the gate electrode associated with MWLBn−1 with two contacts on each side of the gate electrode, where the two contacts are coupled to a word line (e.g., WLm−14) and a word driver line (e.g., FXT0), respectively.

In the example in FIG. 11B, even-numbered word lines are shown in the layout 1100, which may implement the subword driver block 704 (FIG. 7). With reference to FIGS. 7, 10 and 11B, it is appreciated that the circuit implemented in the layout 1100 may implement one or more SWD blocks 1010. For example, for a given memory cell array 1006, subword drivers associated with even-numbered word lines for the given memory cell array may be laid out in a similar manner as shown in FIG. 11B and arranged adjacent to the left side of the memory cell array. Similarly, subword drivers associated with odd-numbered word lines for the memory cell array may be laid out in a similar manner as shown in FIG. 11B and arranged adjacent to the right side of the memory cell array. In some embodiments of the disclosure, the layout of the subword drivers associated with the odd numbered word lines may be arranged in a mirror arrangement relative to the subword drivers associated with the even numbered word lines.

Figure 11C:
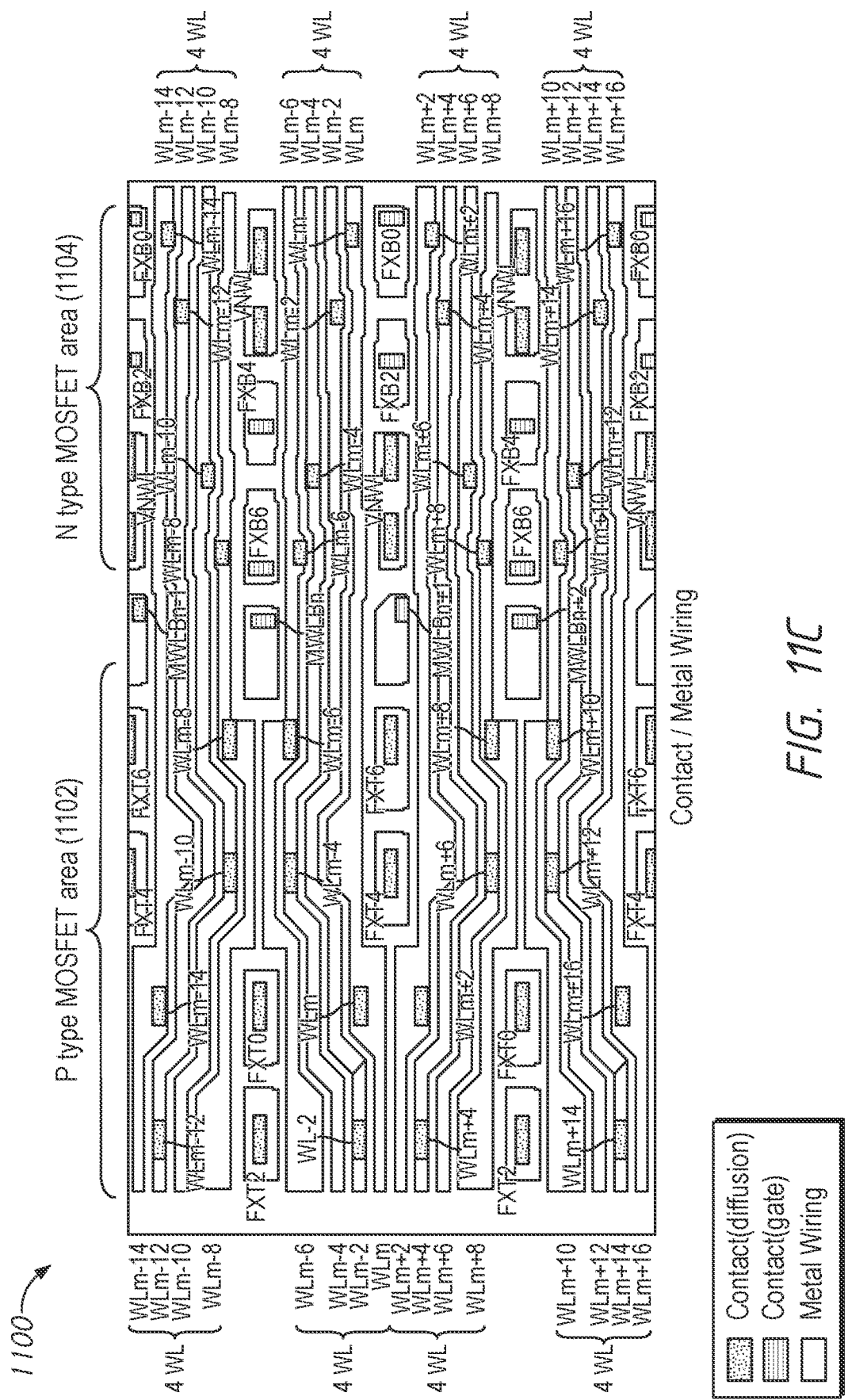
FIG. 11C is a plan view of an example layout diagram of the subword drivers in FIGS. 11A and 11B showing additional layers according to some examples described in the disclosure.

FIG. 11C is a plan view of an example layout diagram of the subword drivers in FIGS. 11A and 11B showing additional layers according to some examples described in the disclosure. In some examples, the layout 1100 may further include one or more metal wiring layers above the active regions and gate layers and contacts for the multiple word lines (as shown in FIG. 11B) that are coupled to the wiring layer to couple to respective memory cells in the memory cell array.

Figure 12A:
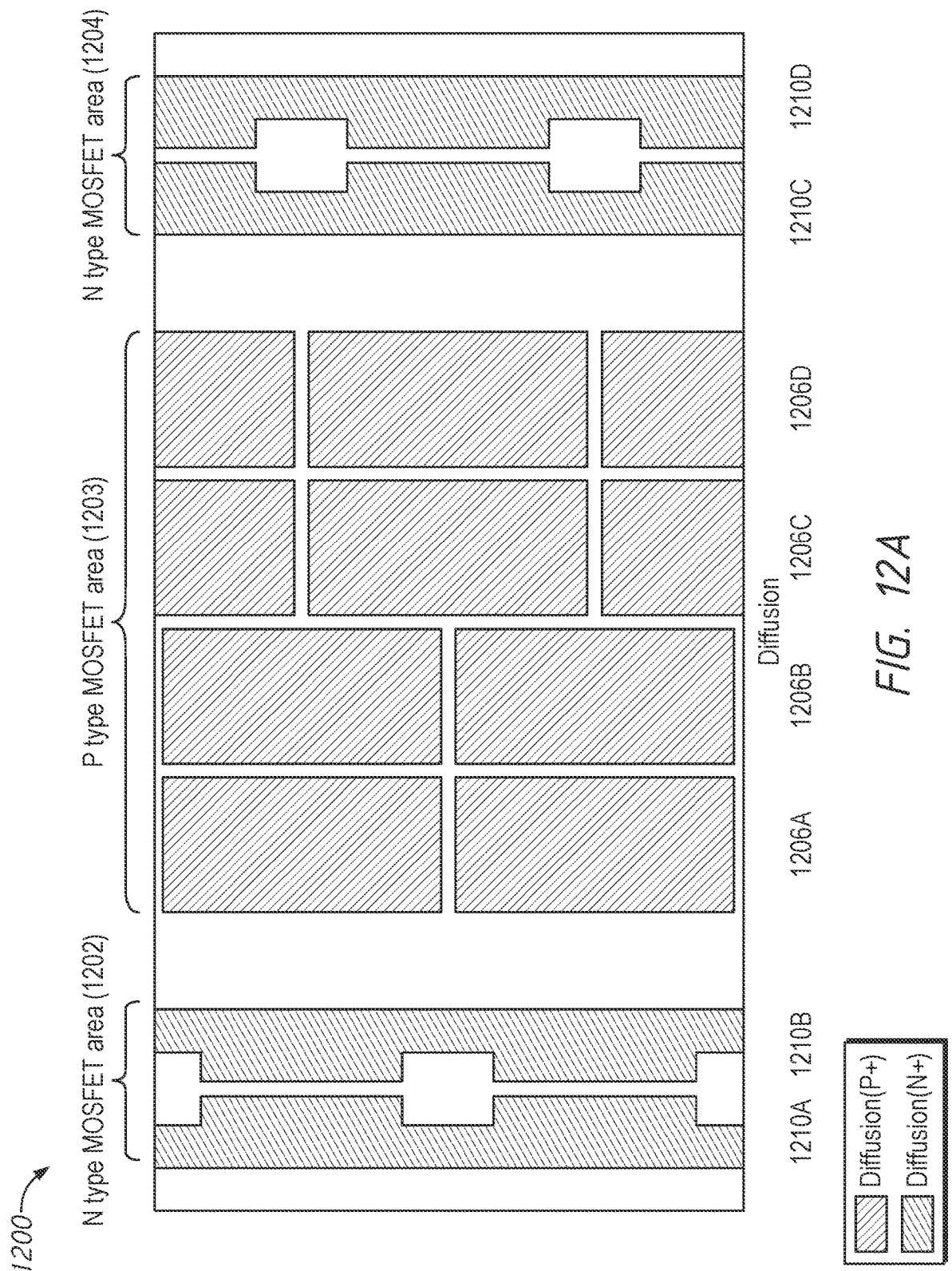
FIG. 12A is a plan view of an example layout diagram of subword drivers showing active regions according to some examples described in the disclosure.
Figure 12B:
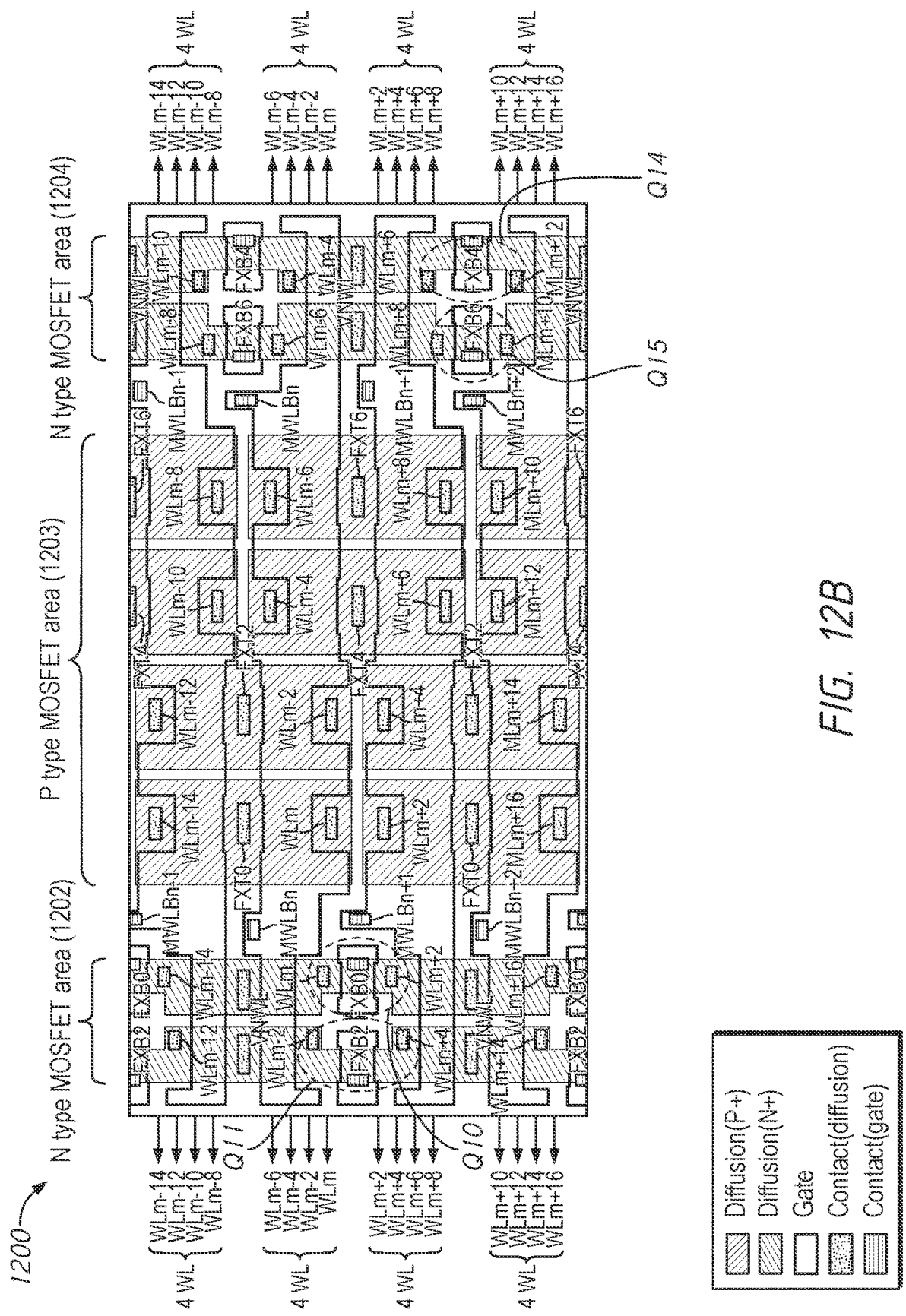
FIG. 12B is a plan view of an example layout diagram of the subword drivers in FIG. 12A showing additional layers according to some examples described in the disclosure.
Figure 12C:
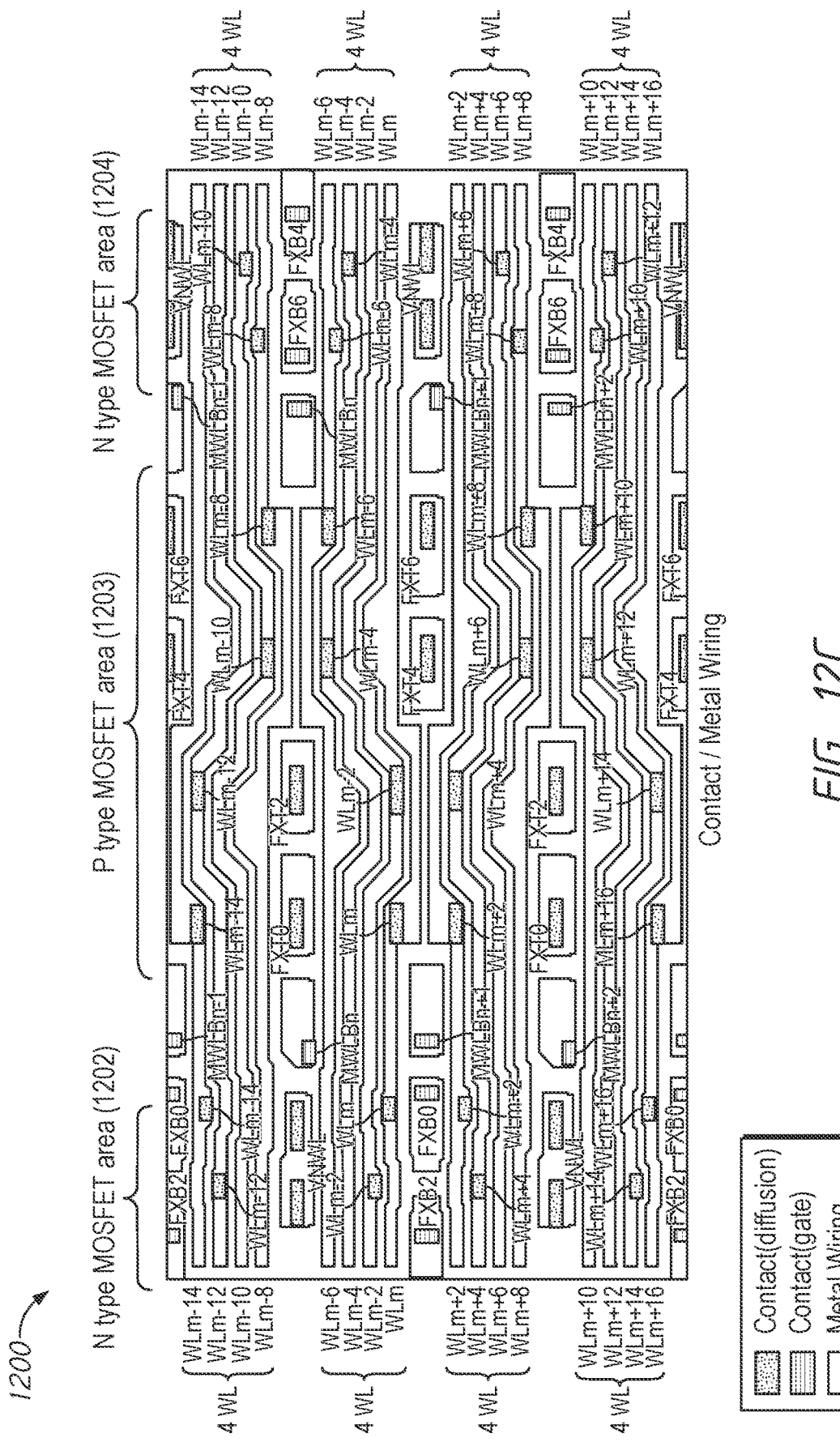
FIG. 12C is a plan view of an example layout diagram of the subword drivers in FIGS. 12A and 12B showing additional layers according to some examples described in the disclosure.

FIGS. 12A-12C illustrate a variation of the layout diagram in FIGS. 11A-C. For example, FIG. 12A is a plan view of an example layout diagram of subword drivers showing active regions according to some examples described in the disclosure. FIG. 12B is a plan view of an example layout diagram of the subword drivers in FIG. 12A showing additional layers according to some examples described in the disclosure. FIG. 12C is a plan view of an example layout diagram of the subword drivers in FIGS. 12A and 12B showing additional layers according to some examples described in the disclosure. A layout 1200 may implement the same subword driver block in FIGS. 11A-C in a similar manner, the description of the layout and operation of the subword driver block will not repeated.

A variation shown in FIGS. 12A-C includes a different arrangement of the p-channel type and n-channel type MOSFET regions. As shown in FIG. 12A, a layout 1200 includes a p-channel type area 1203 disposed between adjacent n-channel type areas 1202 and 1204. Comparing FIGS. 12A-C to FIGS. 11A-C, it is shown that the n-channel type area 1104 in layout 1100 is split into a first n-channel type sub-region and a second n-channel type sub-region which are placed on opposite sides of the p-channel type area. For example, a first n-channel type sub-region 1202 may correspond to the n-channel type sub-regions 1110A, 1110B in FIG. 11A; and a second n-channel type sub-region 1204 may correspond to the n-channel type sub-regions 11110C, 1110D in FIG. 11A.

With reference to FIG. 12B, in the first n-type sub-region 1202, common transistors Q10, Q11 included in different subword drivers are formed in cascade connections between different drains/sources at outputs of the different subword drivers, which are respectively coupled to word lines in a similar manner as Q10, Q11 are formed in FIG. 11B. Similar to FIG. 11B, common transistors Q10, Q11 also correspond to transistors Q10, Q11 in FIG. 7. In the second n-type sub-region 1204, common transistors Q14, Q15 included in different subword drivers are formed in cascade connections between different drains/sources at outputs of the different subword drivers, which are respectively coupled to word lines in a similar manner as Q14, Q15 are formed in FIG. 11B. Similar to FIG. 11B, common transistors Q14, Q15 also correspond to transistors Q14, Q15 in FIG. 7. As shown in FIGS. 12A-C, the layout 1200 becomes symmetric. This may provide advantages in designing the layout of the circuit.

Figure 13A:
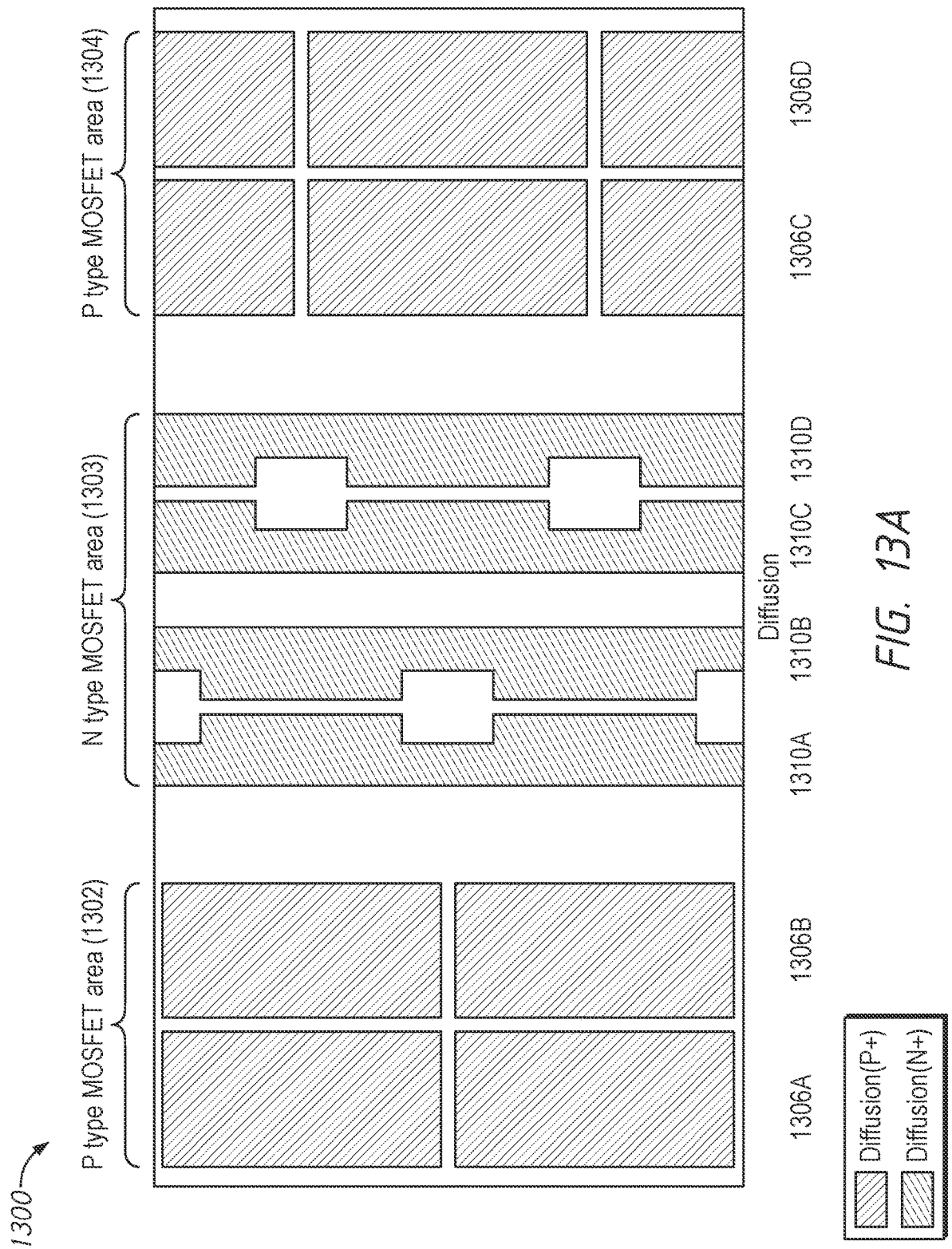
FIG. 13A is a plan view of an example layout diagram of subword drivers showing active regions according to some examples described in the disclosure.
Figure 13B:
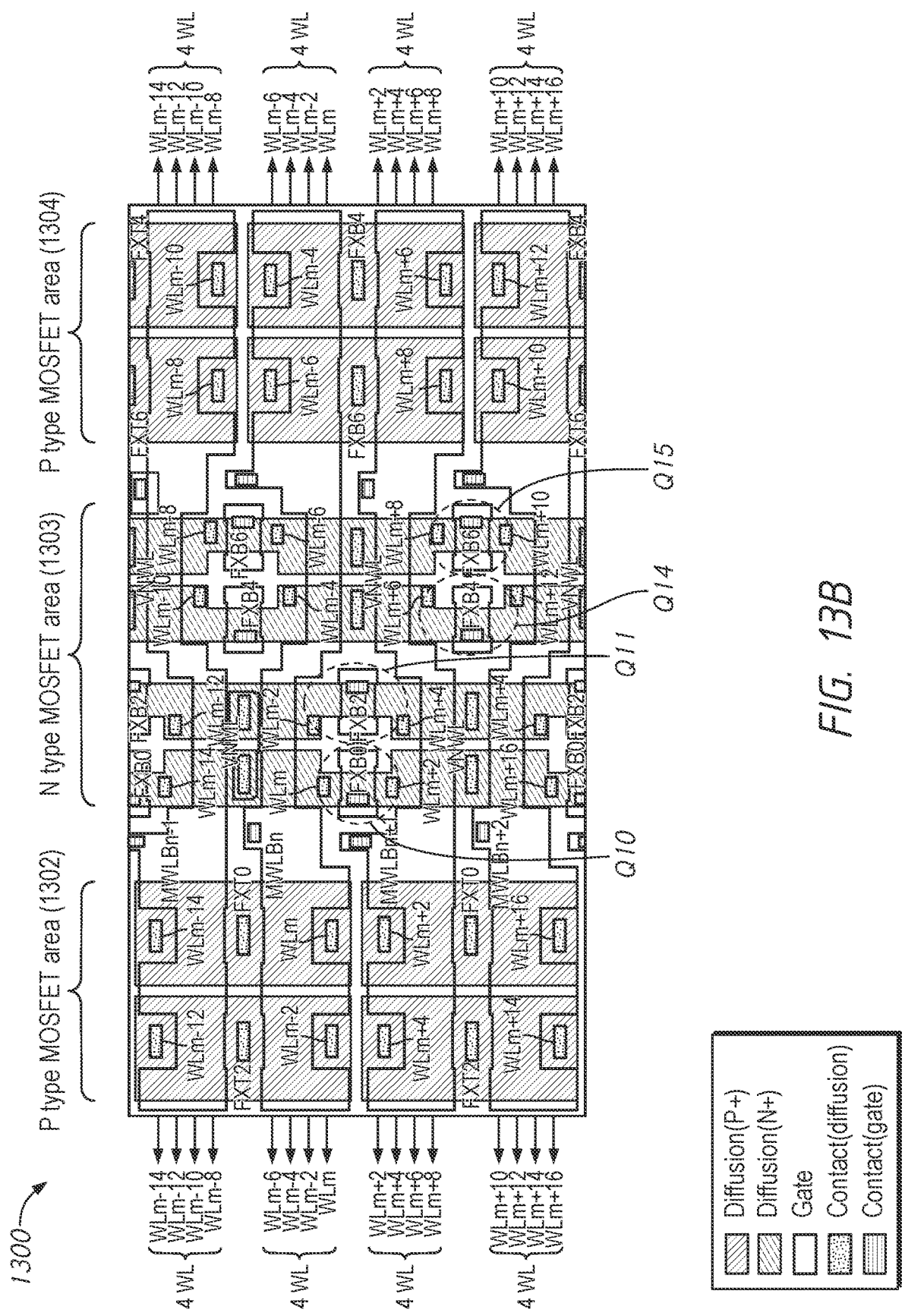
FIG. 13B is a plan view of an example layout diagram of the subword drivers in FIG. 13A showing additional layers according to some examples described in the disclosure.
Figure 13C:
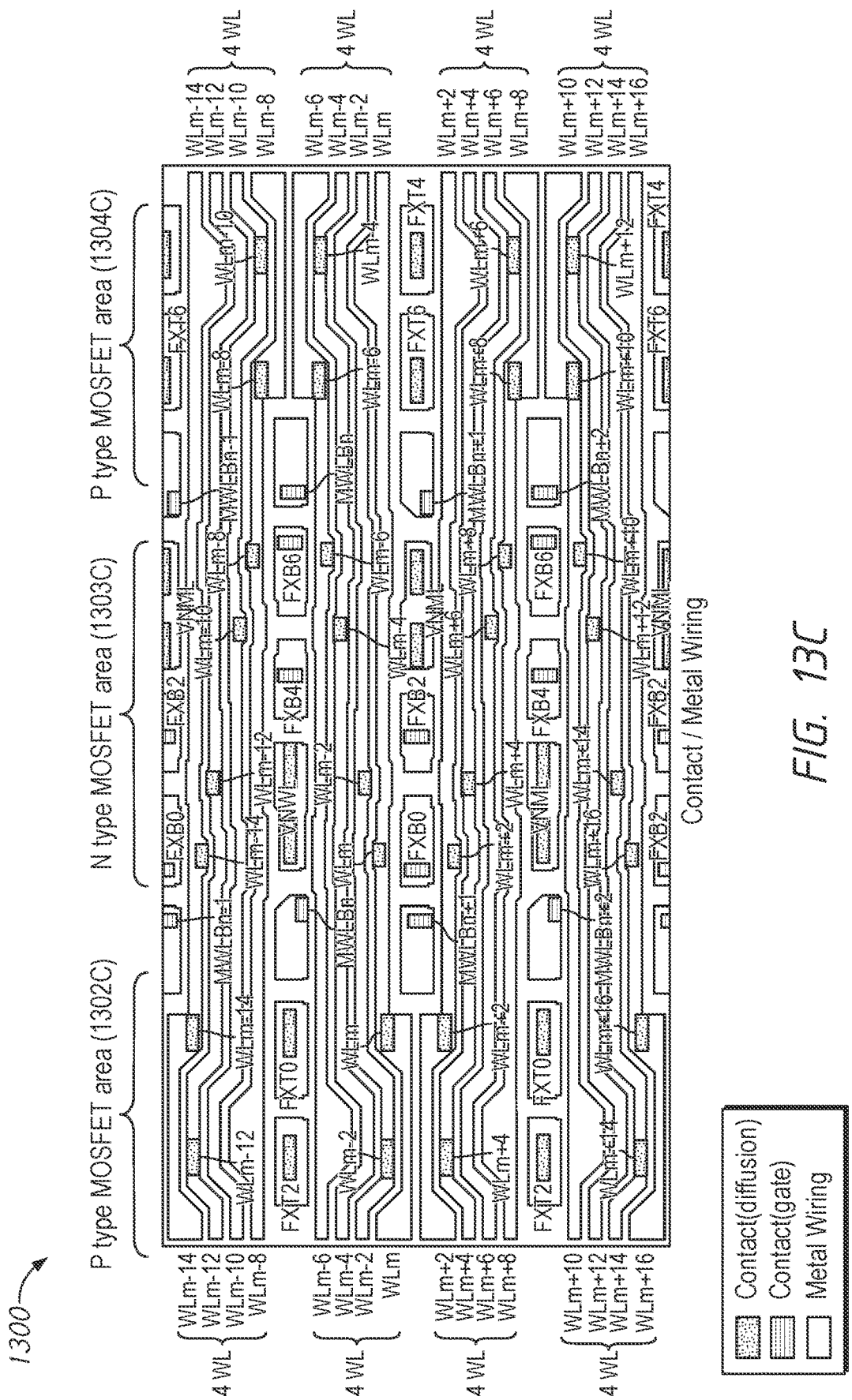
FIG. 13C is a plan view of an example layout diagram of the subword drivers in FIGS. 13A and 13B showing additional layers according to some examples described in the disclosure.

FIGS. 13A-C illustrate another variation of the layout design in FIGS. 11A-C. For example, FIG. 13A is a plan view of an example layout diagram of subword drivers showing active regions according to some examples described in the disclosure. FIG. 13B is a plan view of an example layout diagram of the subword drivers in FIG. 13A showing additional layers according to some examples described in the disclosure. FIG. 13C is a plan view of an example layout diagram of the subword drivers in FIGS. 13A and 13B showing additional layers according to some examples described in the disclosure. A layout 1300 may implement the same subword driver block as FIGS. 11A-C and 12A-C in a similar manner, the description of the layout and operation of the subword driver block will not repeated.

A variation shown in FIGS. 13A-C includes a different arrangement of the p-channel type and n-channel type areas. As shown in FIG. 13A, a layout 1300 includes an n-channel type area 1303 disposed between adjacent p-channel type areas 1302 and 1304. Comparing FIGS. 13A-C to FIGS. 11A-C, it is shown that the p-channel type area 1102 in layout 1100 is split into a first p-channel type sub-region and a second p-channel type sub-region, which are placed on opposite sides of the n-channel type area. For example, a first p-channel type sub-region 1302 in FIG. 13A may correspond to the p-channel type sub-regions 1106A, 1106B in FIG. 11A; and a second p-channel type sub-region 1304 in FIG. 13A may correspond to the p-channel type sub-regions 1106C and 1106D.

With reference to FIG. 13B, the n-channel type area 1303 has a similar layout as the n-channel type area 1104 in FIG. 11B. For example, common transistors Q10, Q11 included in different subword drivers are formed in cascade connections between drains/sources at outputs of the different subword drivers, which are respectively coupled to word lines in a similar manner as Q10, Q11 in FIG. 11B are formed. Similar to FIG. 11B, the common transistors Q10, Q11 also correspond to transistors Q10, Q11 in FIG. 7. In another example, common transistors Q14, Q15 included in different subword drivers are formed in cascade connections between drains/sources at outputs of different subword drivers, which are respectively coupled to word lines in a similar manner as Q14, Q15 in FIG. 11B are formed. Similar to FIG. 11B, the common transistors Q14, Q15 also correspond to transistors Q14, Q15 in FIG. 7. As shown in FIGS. 13A-C, the layout 1300 also becomes symmetric. This may provide advantages in optimizing the layout design of the circuit. In addition, when the n-channel type area is between two p-channel type areas, the p-type well can be separated from other regions, so that the back bias of the n-channel type area can be changed from VBB (−0.5V) to VSS, A shallow back bias may provide the advantage of improving the resistance to hot carriers in the semiconductor device.

FIGS. 1-13 provide various advantages in reduce the memory die size over conventional subword drivers. For examples, common transistors in adjacent subword drivers are placed between outputs of the adjacent subword drivers, which configuration reduces the number of transistors in the subword driver block from an average of three transistors per subword driver to 2.5 transistors per subword driver. This reduction of the number of transistors results in a reduction of layout space. Further, FIGS. 11-13(A-C) provide various configurations of the layout of subword driver block with routing and placement of wiring that may be advantageous in minimizing the complexity and waste of space in the layout design.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus comprising:
    a first main word line;
    a second main word line;
    a third main word line;
    a first subword driver coupled to a first common transistor and the first main word line;
    a second subword driver coupled to the first common transistor and the second main word line;
    a third subword driver coupled to a second common transistor and the first main word line; and
    a fourth subword driver coupled to the second common transistor and the third main word line, wherein
    the apparatus further comprises:
        a third common transistor;
        a fifth subword driver; and
        a sixth subword driver, wherein at least the fifth subword driver and the six subword driver are coupled to the third common transistor, the apparatus further comprises:
a fourth common transistor;
a seventh subword driver; and
an eighth subword driver, wherein the seventh subword driver and the eighth subword driver are coupled to the fourth common transistor, and
the fifth and seventh subword drivers are coupled to the first main word line, the sixth subword driver is coupled to the second main word line, and the eighth subword driver is coupled to the third main word line.

2. The apparatus of claim 1, further comprising:
a memory cell block comprising a plurality of memory cells; and
a first subword driver block coupled to the memory cell block, the first subword driver block comprising the first, second, third, and fourth subword drivers, each configured to drive a respective word line coupled to the memory cell block.

3. The apparatus of claim 1, wherein the first common transistor is formed in an n-channel type area.

4. The apparatus of claim 1, further comprising a gate that is disposed between the first and the third main word lines on a diffusion sub region.

5. An apparatus, comprising:
a first main word line;
a second main word line;
a third main word line;
a first subword driver coupled to a first common transistor and the first main word line;
a second subword driver coupled to the first common transistor and the second main word line;
a third subword driver coupled to a second common transistor and the first main word line; and
a fourth subword driver coupled to the second common transistor and the third main word line, wherein
a layout of subword drivers associated with odd numbered word lines is in a mirror arrangement relative to a layout of subword drivers associated with even numbered word lines.

6. The apparatus of claim 5, wherein the first common transistor is formed in an n-channel type area.

7. The apparatus of claim 5, further comprising:
a gate that is disposed between the first and the third main word lines on a diffusion sub region.

8. An apparatus, comprising:
a first main word line;
a second main word line;
a third main word line;
a first subword driver coupled to a first common transistor and the first main word line;
a second subword driver coupled to the first common transistor and the second main word line;
a third subword driver coupled to a second common transistor and the first main word line; and
a fourth subword driver coupled to the second common transistor and the third main word line, wherein
the apparatus further comprises a gate that is disposed between the first and the third main word lines on a diffusion sub region, and
a width of the diffusion sub region includes a portion where the gate intersects that is narrower than other portions of the diffusion sub region.

9. An apparatus comprising:
a memory cell block;
a first subword driver block coupled to the memory cell block, the first subword driver block including:
a first subword driver coupled to a first main word line and a first common transistor, and configured to drive a first even-numbered word line; and
a second subword driver coupled to a second main word line and the first common transistor, and configured to drive a second even-numbered word line; and
a second subword driver block coupled to the memory cell block, the second subword driver block including:
a third subword driver coupled to the first main word line and a second common transistor, and configured to drive a first odd-numbered word line; and
a fourth subword driver coupled to the second main word line and the second common transistor, and configured to drive a second odd-numbered word line, wherein
the first and second subword driver blocks are arranged on opposite sides of the memory cell block.

10. The apparatus of claim 9, wherein the memory cell block comprises a plurality of memory cells.

11. The apparatus of claim 9, wherein the first subword driver block is in a mirror arrangement relative to the second subword driver block.

12. The apparatus of claim 9, wherein the first and second subword drivers are in a first active region.

13. The apparatus of claim 9, wherein the third and fourth subword drivers are in a second active region.

14. The apparatus of claim 9, further comprising:
a gate that is disposed between the first and the second main word lines on a diffusion sub region.

15. An apparatus comprising:
a first subword driver coupled to a first main word line and a first common transistor, and configured to drive a first word line;
a second subword driver coupled to a second main word line and the first common transistor, and configured to drive a second word line;
a third subword driver coupled to the first main word line and a second common transistor, and configured to drive a third word line; and
a fourth subword driver coupled to the second main word line and the second common transistor, and configured to drive a fourth word line, wherein
the apparatus further comprises a gate that is disposed between the first and the second main word lines on a diffusion sub region, and
a width of the diffusion sub region includes a portion where the gate intersects that is narrower than other portions of the diffusion sub region.

16. A method, comprising:
driving, by a first subword driver coupled to a first main word line and a first common transistor, a first even-numbered word line;
driving, by a second subword driver coupled to a second main word line and the first common transistor, a second even-numbered word line;
driving, by a third subword driver coupled to the first main word line and a second common transistor, a first odd-numbered word line; and
driving, by a fourth subword driver coupled to the second main word line and the second common transistor, a second odd-numbered word line, wherein the first and second subword drivers are in a first subword driver block and the third and fourth subword drivers are in a second subword driver block, and the first and second subword driver blocks are coupled to a memory cell block and arranged on opposite sides of the memory cell block.

17. The method of claim 16, wherein the first and second subword drivers are in a first active region.

18. The method of claim 16, wherein the third and fourth subword drivers are in a second active region.

* * * * *